(12) United States Patent
Ho et al.

(10) Patent No.: US 10,030,857 B2
(45) Date of Patent: Jul. 24, 2018

(54) ILLUMINATION DEVICE

(71) Applicant: EPISTAR CORPORATION, Hsinchu (TW)

(72) Inventors: Chih-Ping Ho, Tao-Yuan Hsien (TW); Chih-Wei Liao, Tao-Yuan Hsien (TW); Shyi-Ming Pan, Tao-Yuan Hsien (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/631,482

(22) Filed: Jun. 23, 2017

(65) Prior Publication Data

US 2017/0284644 A1 Oct. 5, 2017

Related U.S. Application Data

(63) Continuation of application No. 14/340,574, filed on Jul. 25, 2014, now Pat. No. 9,711,490, which is a
(Continued)

(30) Foreign Application Priority Data

May 29, 2012 (TW) .............................. 101119098 A
Jun. 19, 2012 (TW) .............................. 101121921 A
(Continued)

(51) Int. Cl.
| | |
|---|---|
| *H01L 33/48* | (2010.01) |
| *F21V 21/14* | (2006.01) |
| *H01L 33/50* | (2010.01) |
| *H01L 33/62* | (2010.01) |
| *F21V 17/10* | (2006.01) |

(Continued)

(52) U.S. Cl.
CPC ............... *F21V 21/14* (2013.01); *F21V 3/02* (2013.01); *F21V 17/10* (2013.01); *F21V 23/06* (2013.01);
(Continued)

(58) Field of Classification Search
CPC . F21V 21/14; F21V 29/85; F21V 3/02; F21V 17/10; F21V 23/06; H01L 33/507; H01L 33/62

See application file for complete search history.

(56) References Cited

U.S. PATENT DOCUMENTS

| | | | |
|---|---|---|---|
| 5,168,023 A | 12/1992 | Mitani | |
| 8,247,976 B2 * | 8/2012 | Chuang | ..................... F21V 3/00 313/25 |

(Continued)

FOREIGN PATENT DOCUMENTS

| | | |
|---|---|---|
| EP | 2392851 A1 | 12/2011 |
| EP | 2445006 A2 | 4/2012 |

(Continued)

*Primary Examiner* — Anabel Ton
(74) *Attorney, Agent, or Firm* — Muncy, Geissler, Olds & Lowe, P.C.

(57) ABSTRACT

An illumination device includes a supporting base, and a light-emitting element inserted in the supporting base. The light-emitting element includes a substrate having a supporting surface and a side surface, a light-emitting chip disposed on the supporting surface, and a first wavelength conversion layer covering the light-emitting chip and only a portion of the supporting surface without covering the side surface.

20 Claims, 25 Drawing Sheets

Related U.S. Application Data continuation-in-part of application No. 13/904,038, filed on May 29, 2013, now Pat. No. 9,123,868, and a continuation-in-part of application No. 13/903,998, filed on May 28, 2013.

(60) Provisional application No. 61/893,908, filed on Oct. 22, 2013.

(30) Foreign Application Priority Data

| | | |
|---|---|---|
| Jul. 16, 2012 | (TW) | 101125599 A |
| Aug. 28, 2012 | (TW) | 101131198 A |
| Aug. 30, 2012 | (TW) | 101131643 A |
| Sep. 4, 2012 | (TW) | 101132185 A |
| Sep. 4, 2012 | (TW) | 101132187 A |
| May 8, 2013 | (TW) | 102116429 A |
| May 10, 2013 | (TW) | 102116650 A |

(51) Int. Cl.

| | |
|---|---|
| *F21V 23/06* | (2006.01) |
| *F21V 3/02* | (2006.01) |
| *F21V 29/85* | (2015.01) |
| *F21Y 115/10* | (2016.01) |

(52) U.S. Cl.
CPC ............ *F21V 29/85* (2015.01); *H01L 33/507* (2013.01); *H01L 33/62* (2013.01); *F21Y 2115/10* (2016.08)

(56) References Cited

U.S. PATENT DOCUMENTS

| | | | |
|---|---|---|---|
| 8,410,501 | B2 | 4/2013 | Shida et al. |
| 8,587,011 | B2 | 11/2013 | Matsuda |
| 9,024,349 | B2 | 5/2015 | Chitnis |
| 9,029,898 | B2* | 5/2015 | Pu ............... H01L 33/38 |
| | | | 257/88 |
| 9,123,868 | B2* | 9/2015 | Pan ............. H01L 25/0753 |
| 9,261,242 | B2 | 2/2016 | Ge |
| 2007/0139949 | A1 | 6/2007 | Tanda |
| 2008/0128731 | A1 | 6/2008 | Den Baars |
| 2009/0008654 | A1 | 1/2009 | Nagai |
| 2011/0006312 | A1 | 1/2011 | Hsu |
| 2011/0163683 | A1 | 7/2011 | Steele |
| 2012/0118222 | A1 | 5/2012 | Fujiwara |
| 2012/0193650 | A1* | 8/2012 | Cheng ............... F21K 9/90 |
| | | | 257/88 |
| 2013/0271972 | A1* | 10/2013 | Hussell ............. F21V 3/00 |
| | | | 362/231 |

FOREIGN PATENT DOCUMENTS

| | | |
|---|---|---|
| JP | 2007324578 A | 12/2007 |
| KR | 1020110099513 A | 9/2011 |
| TW | 200414561 A | 8/2004 |
| TW | M453804 U | 5/2013 |
| WO | WO2010065860 A2 | 6/2010 |

* cited by examiner

ILLUMINATION DEVICE

CROSS REFERENCE TO RELATED APPLICATIONS

This present application is a continuation application of U.S. patent application Ser. No. 14/340,574, filed on Jul. 25, 2014, which is a Continuation in Part application of U.S. application Ser. No. 13/904,038, filed on May 29, 2013 claiming the benefit of U.S. provisional application No. 61/893,908, filed on Oct. 22, 2013, and The entire contents of these related applications are incorporated herein by reference.

BACKGROUND OF THE INVENTION

1. Field of the Invention

The present invention relates to a semiconductor light emitting element and an illumination device thereof, and more particularly, to a semiconductor light emitting element providing light in multi-directions, and an illumination device including the semiconductor light emitting element.

2. Description of the Prior Art

A light beam emitted from a light emitting diode (LED) is a kind of directional light source, which is different from a dispersive light source of a conventional bulb. Accordingly, applications of LED are limited. For instance, the conventional LED cannot or may be hard to provide required lighting effect for indoor and outdoor illumination applications. Additionally, conventional LED illumination devices emit light beams from a single side and luminous efficiency of the conventional LED illumination device is relatively low accordingly.

SUMMARY OF THE INVENTION

The present invention provides an illumination device.

The illumination device includes a supporting base, and a light-emitting element inserted in the supporting base. The light-emitting element includes a substrate having a supporting surface and a side surface, a light-emitting chip disposed on the supporting surface, and a first wavelength conversion layer covering the light-emitting chip and only a portion of the supporting surface without covering the side surface.

These and other objectives of the present invention will no doubt become obvious to those of ordinary skill in the art after reading the following detailed description of the preferred embodiment that is illustrated in the various figures and drawings.

DETAILED DESCRIPTIONS

Figure 1:
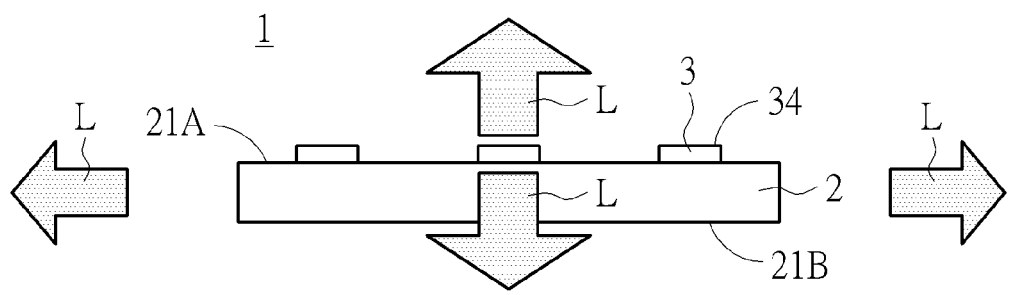
FIG. 1 and FIG. 2 are schematic structure diagrams illustrating a semiconductor light emitting element according to a preferred embodiment of the present invention.
Figure 2:
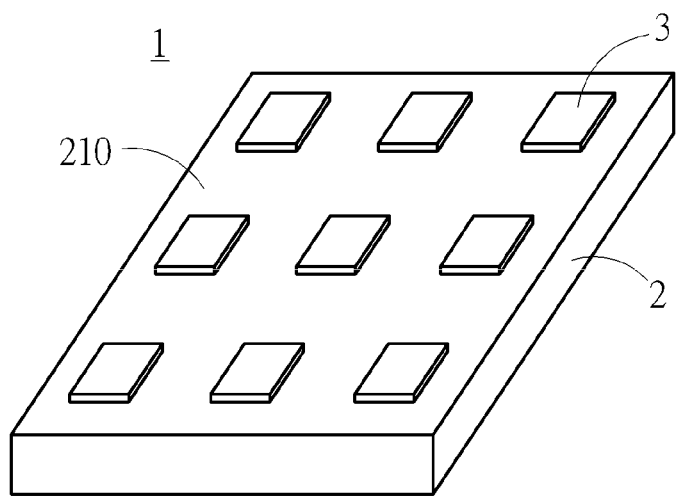

Please refer to FIG. 1 and FIG. 2. FIG. 1 and FIG. 2 are schematic structure diagrams illustrating a semiconductor light emitting element according to a preferred embodiment of the present invention. As shown in FIG. 1 and FIG. 2, a semiconductor light emitting element 1 includes a transparent substrate 2, a support surface 210, a first main surface 21A, a second main surface 21B and at least one light emitting diode (LED) structure 3 providing light in multi-directions. The transparent substrate 2, which is a sheet type substrate, has two main surfaces, and one of the surfaces is the support surface 210. The LED structure 3 capable of emitting light is disposed on the support surface 210. A light emitting surface 34 of the LED structure 3 uncovered by the transparent substrate 2 and at least a part of the support surface 210 without the LED structure form the first main surface 21A where light emitted from. The second main surface 21B is another main surface of the transparent substrate 2 without the LED structures 3. The disposition described above may also be reversed, or the LED structure 3 may be disposed on the two surfaces of the transparent substrate 2. In one embodiment, LED structures 3 may be disposed on the support surface 210 of the transparent substrate 2 interlacedly corresponding to other LED structures 3 disposed on the second main surface 21B, such that light beams emitted from LED structures 3 on one surface of the transparent substrate 2 would not be blocked by other LED structures 3 on another surface of the transparent substrate 2. The luminance of the semiconductor light emitting element 1 may be increased accordingly. A material of the transparent substrate 2 may comprise one selected from aluminum oxide (Al2O3), sapphire containing aluminum oxide, silicon carbide (SiC), glass, plastic or rubber. Preferably, the transparent substrate may be a sapphire substrate in a preferred embodiment of the present invention. The structure of the sapphire substrate is substantially single crystal. The sapphire substrate has properties of higher light transmittance and better heat dissipation capability. The sapphire substrate may be used to increase the life time of the semiconductor light emitting element 1. However, the conventional sapphire substrate used for growing a conventional light emitting diode may be fragile when applied in the present invention. According to experiment results of the present invention, the transparent substrate 2 of the present invention is preferably a sapphire substrate having a thickness thicker than or equal to 200 micrometers so as to perform better reliability, supporting performance and transparency. For effectively emitting light in multi-directions, including dual-directions or full directions, from the semiconductor light emitting element 1, the LED structure 3 in this invention preferably has a beam angle greater than 180 degrees. Accordingly, the LED structure 3 disposed on the transparent substrate 2 may emit light beams from the light emitting surface 34 toward a direction away from the transparent substrate 2, and the LED structure 3 may also emit light beams at least partially entering the transparent substrate 2. The light beams entering the transparent substrate 2 may emerge from the second main surface 21B opposite to the first main surface 21A, and the light beams entering the transparent substrate 2 may also be emitted from a part of the support surface 210 without LED structures 3 or emitted from other surface of the transparent substrate 2. The semiconductor light emitting element 1 may then be capable of emitting light in multi-directions including dual-directions or full directions. In this invention, an area of the first main surface 21A or an area of the second main surface 21B is larger than 5 times of a total area formed from at least one of the light emitting surfaces 34 of each LED structure, and this is a preferred proportion according to the consideration of both the luminous efficiency and the heat dissipation performance.

Additionally, in another preferred embodiment of the present invention, a difference in color temperatures of light beams emitted from the first main surface 21A and the second main surface 21B is smaller than or equal to 1500K so as to uniform light emitting effects of the semiconductor light emitting element 1. In addition, under the thickness condition of the transparent substrate 2 mentioned above, a light transmittance of the transparent substrate 3 is larger than or equal to 70% for light beams having a wavelength range larger than or equal to 420 nanometers, or light beams having a wavelength rage smaller than or equal to 470 nanometers.

The present invention is not limited to the embodiment described above. The following description will detail the different embodiments in the present invention. To simplify the description, similar components in each of the following embodiments are marked with identical symbols. For making it easier to understand the differences between the embodiments, the following description will detail the dissimilarities among different embodiments and the identical features will not be redundantly described.

Figure 3:
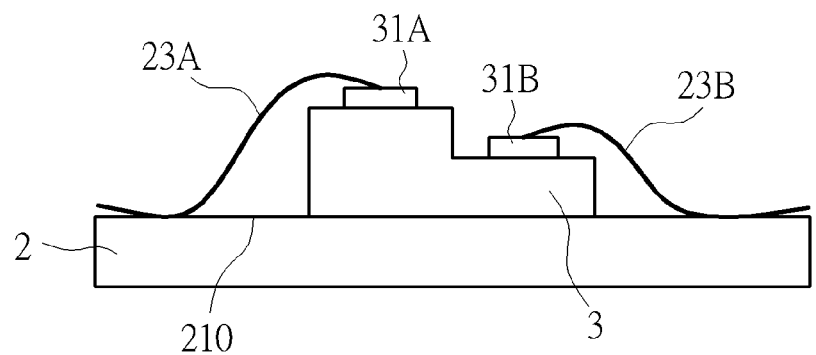
FIGS. 3-5 are schematic diagrams illustrating different types of electrically coupling approaches between a light emitting diode structure and conductors according to a preferred embodiment of the present invention.
Figure 4:
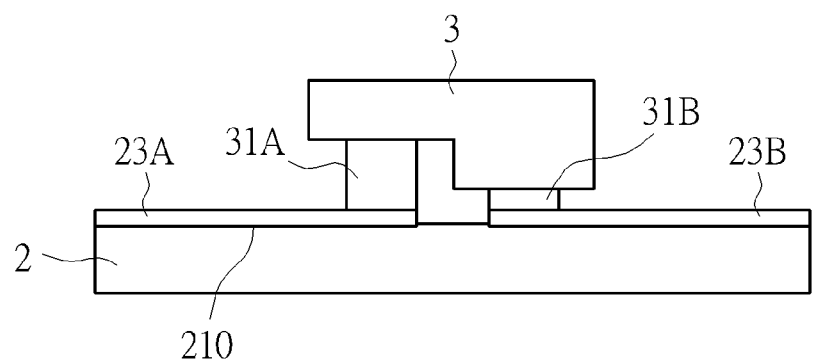
Figure 5:
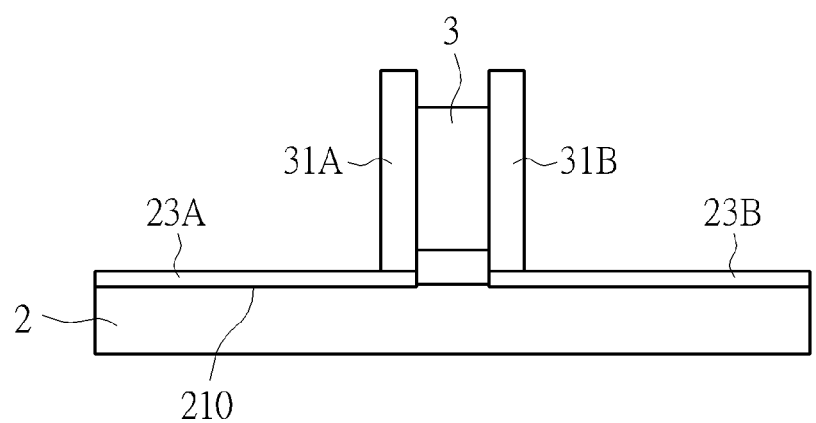

Please refer to FIGS. 3-5. In the present invention, the LED structure 3 includes a first electrode 31A and a second electrode 31B for receiving electricity. The first electrode 31A and the second electrode 31B are respectively and electrically connected to a first connecting conductor 23A and a second connecting conductor 23B on the transparent substrate 2. FIGS. 3-5 are schematic diagrams illustrating different types of electrically coupling approaches between the light emitting diode structure 3 and the conductors. FIG. 3 illustrates a horizontal type LED structure, the LED structure 3 is formed on the support surface 210 of the transparent substrate 2, and the electrodes 31A and 31B are coupled to the connecting conductors 23A and 23B by wire bonding. FIG. 4 illustrates a flip chip type LED structure 3, and the LED structure 3 is disposed reversely and electrically coupled to the transparent substrate 2 by the first electrode 31A and the second electrode 31B. The first electrode 31A and the second electrode 31B may be directly coupled to the first connecting conductor 23A and the second connecting conductor 23B by welding or adhering. As shown in FIG. 5, the first electrode 31A and the second electrode 31B are disposed on different surfaces of the LED structure 3, and the LED structure 3 is vertically disposed so as to respectively connect the electrodes 31A and 31B to the connecting conductors 23A and 23B.

Figure 6:
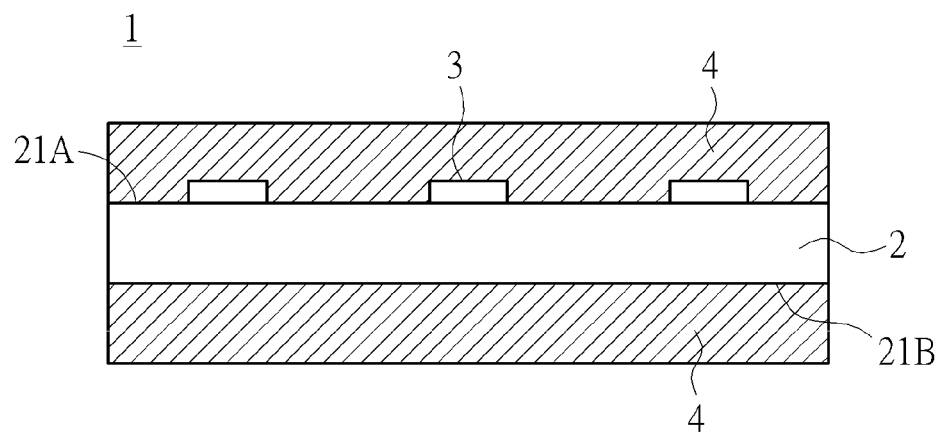
FIG. 6 and FIG. 7 are schematic diagrams illustrating a disposition of a wavelength conversion layer according to a preferred embodiment of the present invention.
Figure 7:
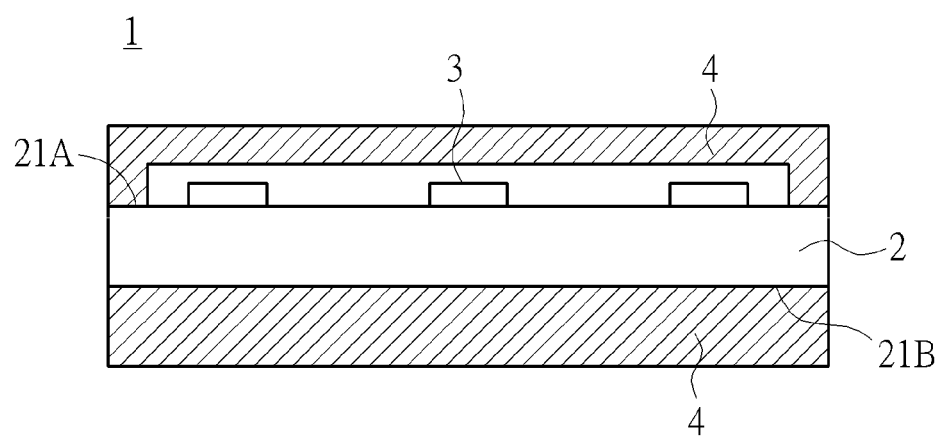

Please refer to FIG. 6 and FIG. 7. The semiconductor light emitting element 1 in the present invention may further include a wavelength conversion layer 4. The wavelength conversion layer 4 may be selectively disposed on the first main surface 21A or/and the second main surface 21B, or directly on the LED structures 3. The wavelength conversion layer 4 may directly contact the LED structures 3, or the wavelength conversion layer 4 may be separated from the LED structures 3 by a distance without directly contact. The wavelength conversion layer 4 contains at least one kind of fluorescent powders such as organic fluorescent powder or inorganic fluorescent powder of garnet series, sulfate series or silicate series. The wavelength conversion layer 4 may then be able to at least partially absorb a light beam emitted from the LED structure 3 and covert the light beam into another light beams having different wavelength range. For example, when blue light beams are emitted from the LED structure 3, a part of the blue light beams may be converted into yellow light beams by the wavelength conversion layer 4, and the blue light beams and the yellow light beams may be mixed for presenting white light beams emitted from the semiconductor light emitting element 1. Additionally, a luminance of the first main surface 21A is different from a luminance of the second main surface 21B because a light source of the first main surface 21A mainly comes from light beams directly emitted from the LED structure 3, and a light source of the second main surface 21B comes from light beams passing through the transparent substrate 2. Therefore, in a semiconductor light emitting element 1 of another preferred embodiment, concentrations of the fluorescent powders in the wavelength conversion layer 4 disposed on the first main surface 21A and the wavelength conversion layer 4 disposed on the second main surface 21B are arranged correspondingly. Preferably, a ratio of a fluorescent powder concentration in the wavelength conversion layer 4 disposed on the first main surface 21A to a fluorescent powder concentration in the wavelength conversion layer 4 disposed on the second main surface 21B may ranges from 1:0.5 to 1:3, or a ratio of the fluorescent powder concentration in the wavelength conversion layer 4 disposed on the second main surface 21B to the fluorescent powders in the wavelength conversion layer 4 disposed on the first main surface 21A may ranges from 1:0.5 to 1:3. The luminance and the lighting effect of the semiconductor light emitting element 1 may become more appropriate for different applications accordingly. A difference in color temperatures of light beams emitted from the first main surface 21A and the second main surface 21B may then be controlled to be smaller than or equal to 1500K. A wavelength converting efficiency and light emitting performance of the semiconductor light emitting element 1 may then be enhanced.

Figure 8:
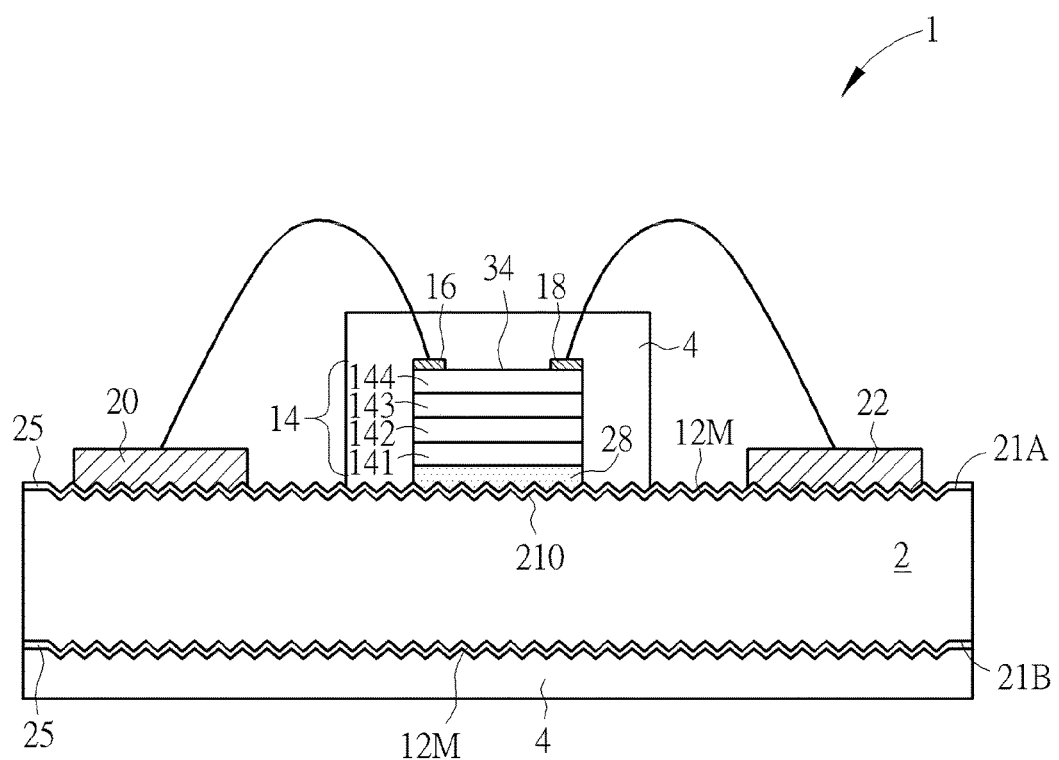
FIG. 8 is a cross-sectional diagram illustrating a semiconductor light emitting element according to another preferred embodiment of the present invention.

Please refer to FIG. 8. FIG. 8 is a cross-sectional diagram illustrating a semiconductor light emitting element 1 according to another preferred embodiment of the present invention. As shown in FIG. 8, the semiconductor light emitting element 1 in this embodiment includes a transparent substrate 2 and at least one LED structure 14 providing light in multi-directions. The transparent substrate 2 has a support surface 210 and a second main surface 21B disposed opposite to each other. The LED structure 14 is disposed on the support surface 210 of the transparent substrate 2. The LED structure 14 includes a first electrode 16 and a second electrode 18. The first electrode 16 and the second electrode 18 are configured to be electrically connected to other devices. A light emitting surface 34 of the LED structure 14 uncovered by the transparent substrate 2 and at least a part of the support surface 210 without the LED structure 14 form a first main surface 21A where light emitted from.

The LED structure 14 may include a substrate 141, an N-typed semiconductor layer 142, an active layer 143 and a P-typed semiconductor layer 144. In this embodiment, the substrate 141 of the LED structure 14 may be attached on the transparent substrate 2 by such as a chip bonding layer 28.

Apart from being used to attach the LED structure 14, a light intensity may also be increased by optimizing the material property of the chip bonding layer 28. For example, a refractive index of the chip bonding layer 28 is preferably between a refractive index of the substrate 141 and a refractive index of the transparent substrate 2 so as to increase the intensity of light emitted from the LED structure 14. In addition, the chip bonding layer 28 may be a transparent adhesive or other appropriate bonding material. The first electrode 16 and the second electrode 18 are disposed on the side of the LED structure 14 opposite to the chip bonding layer 28. The first electrode 16 and the second electrode 18 are electrically connected to the P-typed semiconductor layer 144 and the N-typed semiconductor layer 142 respectively (FIG. 8 does not show the connecting relation between the second electrode 18 and the N-typed semiconductor layer 142). Horizontal level of an upper surface of the first electrode 16 and an upper surface of the second electrode 18 are substantially the same. The first electrode 16 and the second electrode 18 may be metal electrodes, but not limited thereto. In addition, the semiconductor light emitting element 1 further includes a first connecting conductor 20, a second connecting conductor 22 and a wavelength conversion layer 4. The first connecting conductor 20 and the second connecting conductor 22 are disposed on the transparent substrate 2. The first connecting conductor 20 and the second connecting conductor 22 may be metal wires or other conductive patterns, but not limited thereto. The first electrode 16 and the second electrode 18 are respectively connected to the first connecting conductor 20 and the second connecting conductor 22 electrically by wire bonding or welding, but not limited thereto. The wavelength conversion layer 4 is disposed on the transparent substrate 2, and the wavelength conversion layer 4 may cover the LED structure 14. Additionally, the wavelength conversion layer 4 may further cover the second main surface 21B of the transparent substrate 2.

In addition, a non-planar structure 12M may be selectively disposed on the surfaces of the transparent substrate 2 for increasing the intensity of light emitted from the transparent substrate 2 and unifying the distribution of the emitted light. The non-planar structure 12M may be a convex geometric structure or a concave geometric structure, such as a pyramid, a cone, a hemispheroid, a triangular prism and so forth. The non-planar structures 12M may be arranged regularly or randomly. Furthermore, a diamond-like carbon (DLC) film 25 may be selectively disposed on the surfaces of the transparent substrate 2 so as to enhance the thermal conductive ability and the heat dissipating performance.

Figure 9:
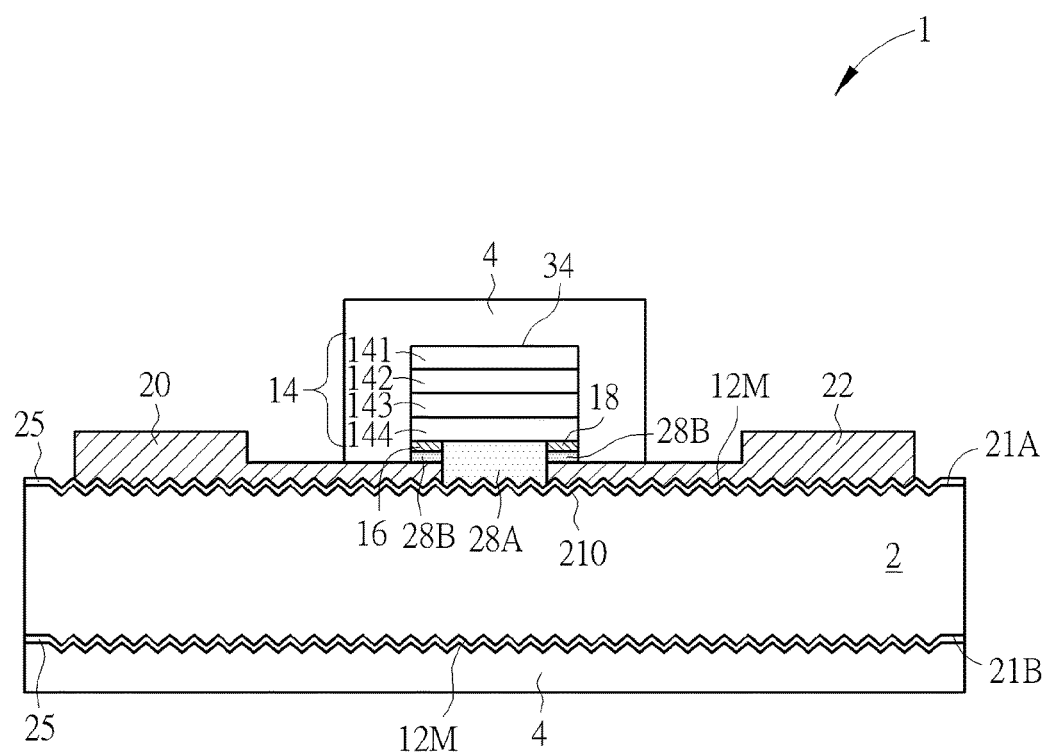
FIG. 9 is a cross-sectional diagram illustrating a semiconductor light emitting element according to another preferred embodiment of the present invention.

Please refer to FIG. 9. FIG. 9 is a cross-sectional diagram illustrating a semiconductor light emitting element according to another preferred embodiment of the present invention. Compared with the embodiment shown in FIG. 8, in the semiconductor light emitting element 1 of this embodiment, the first electrode 16, the second electrode 18 and a first chip bonding layer 28A are disposed on the same surface of the LED structure 14. That the first electrode 16 and the second electrode 18 are electrically connected to the first connecting conductor 20 and the second connecting conductor 22 by flip chip. Wherein the first connecting conductor 20 and the second connecting conductor 22 may respectively extend corresponding to the positions of the first electrode 16 and 18. And the first electrode 16 and the second electrode 18 may be respectively connected to the first connecting conductor 20 and the second connecting conductor 22 electrically through a second chip bonding layer 28B. The second chip bonding layer 28B may be a conductive bump such as a gold bump or a solder bump, a conductive glue such as a silver glue, or an eutectic layer such as an Au—Sn alloy eutectic layer or an In—Bi—Sn alloy eutectic layer, but not limited to this. By employing the second chip bonding layer 28B, the first chip bonding layer 28A under the LED structure 14 may not be required or may be replaced by the wavelength conversion layer 4.

Figure 10:
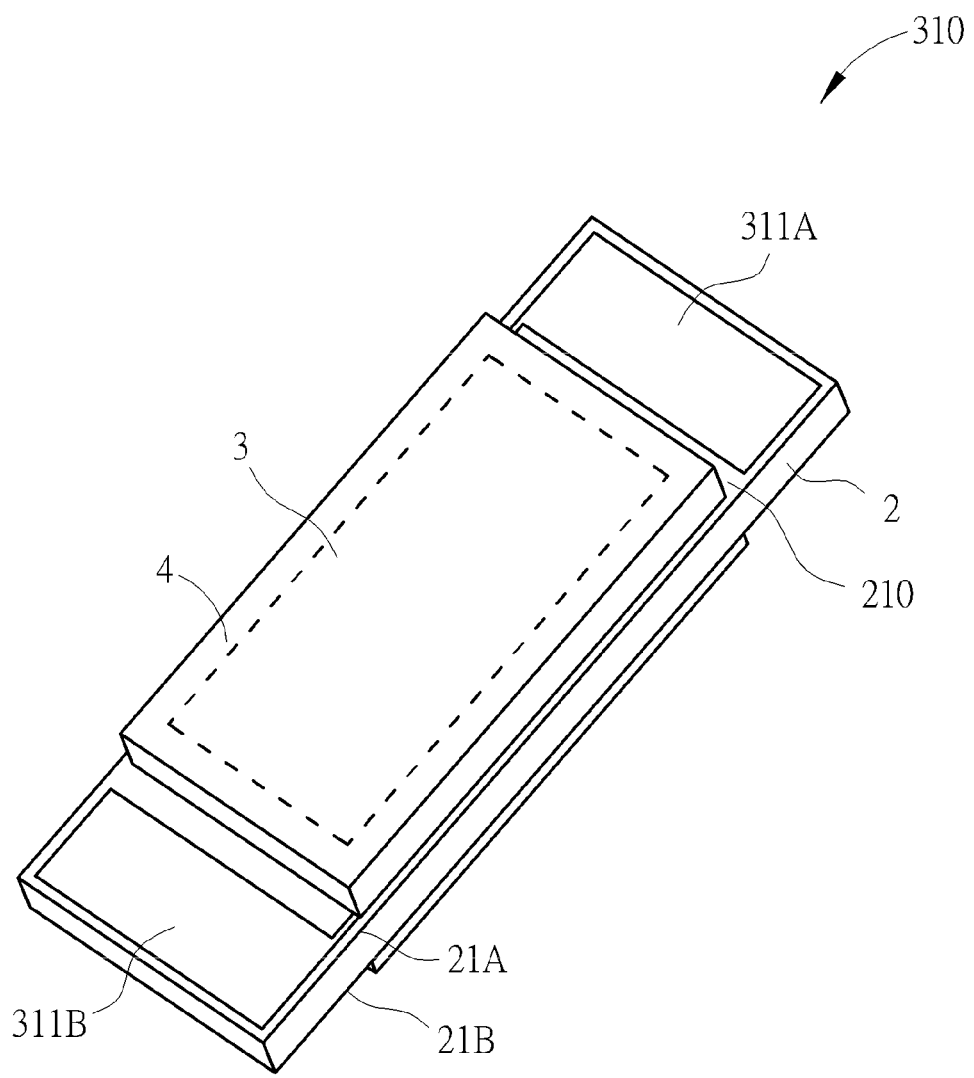
FIG. 10 is a schematic diagram illustrating a semiconductor light emitting element according to another preferred embodiment of the present invention.

Please refer to FIG. 10. FIG. 10 is a schematic diagram illustrating a semiconductor light emitting element according to another preferred embodiment of the present invention. As shown in FIG. 10, a semiconductor light emitting element 310 in this invention includes the transparent substrate 2, at least one LED structure 3, a first connecting electrode 311A, a second connecting electrode 311B and at least one wavelength conversion layer 4. The LED structure 3 is disposed on the support surface 210 of the transparent substrate 2 and forms a first main surface 21A where light emitted from. In this embodiment, the LED structure 3 has a beam angle greater than 180 degrees, and at least a part of light beams emitted from the LED structure 3 penetrate into the transparent substrate 2. At least a part of the penetrating light beams may be emitted from a second main surface 21B which is opposite to the first main surface 21A, and the other penetrating light beams may be emitted from other surfaces of the transparent substrate 2, so as to form the semiconductor light emitting element 310 providing light in multi-directions. The first connecting electrode 311A and the second connecting electrode 311B are respectively disposed on different sides of the transparent substrate 2 or on the same side of the transparent substrate 2 (not shown in FIG. 10). The first connecting electrode 311A and the second connecting electrode 311B may be electrodes of the semiconductor light emitting element 310 respectively formed by extension parts of a first connecting conductor and a second connecting conductor on the transparent substrate 2, and the first connecting electrode 311A and the second connecting electrode 311B are electrically connected to the LED structure 3 accordingly. The wavelength conversion layer 4 at least covers the LED structure 3 and exposes at least a part of the first connecting electrode 311A and the second connecting electrode 311B. The wavelength conversion layer 4 at least partially absorbs a light beam emitted from the LED structure 3 or/and the transparent substrate 2, and coverts the light beam into a light beam having another wavelength range. The converted light and the light which are not absorbed by the wavelength conversion layer 4 are mixed to extend the total wavelength range of the light beams emitted from the semiconductor light emitting element 310 and improve the light emitting performance of the semiconductor light emitting element 310. Because the semiconductor light emitting element 310 in this embodiment includes the first connecting electrode 311A and the second connecting electrode 311B respectively disposed on the transparent substrate 2, traditional LED packaging process may be omitted and the semiconductor light emitting element 310 may be independently manufactured and then combined with an appropriate supporting base. Accordingly, the total manufacturing yield may be improved, the structure may be simplified and applications of the corresponding supporting base may also be increased.

Figure 11:
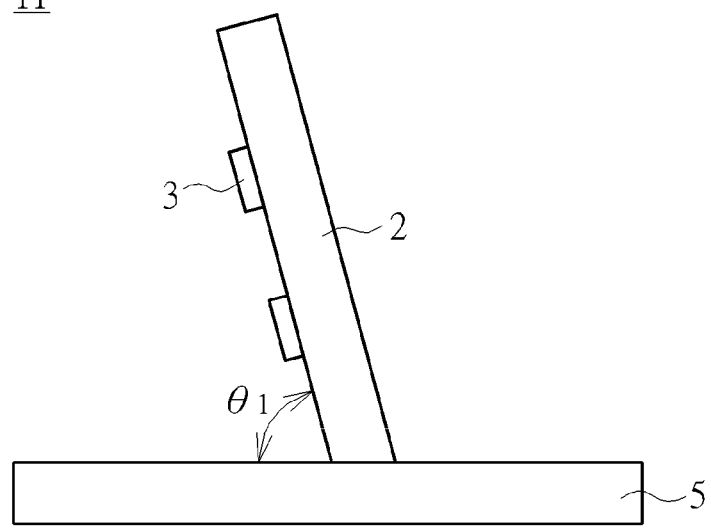
FIG. 11 is a schematic diagram illustrating a supporting base according to a preferred embodiment of the present invention.

Please refer to FIG. 11. An illumination device 11 is provided in this embodiment. The illumination device 11 includes a supporting base 5 and the semiconductor light emitting element described above. The transparent substrate 2 of the semiconductor light emitting element may stand on (or lie on) and be electrically coupled to the supporting base 5. A first angle θ1 exists between the transparent substrate 2 and the supporting base 5. The first angle θ1 may be fixed or be adjusted according to the light shape requirement of the illumination device. Preferably, the first angle θ1 ranges from 30 degrees to 150 degrees.

Figure 12:
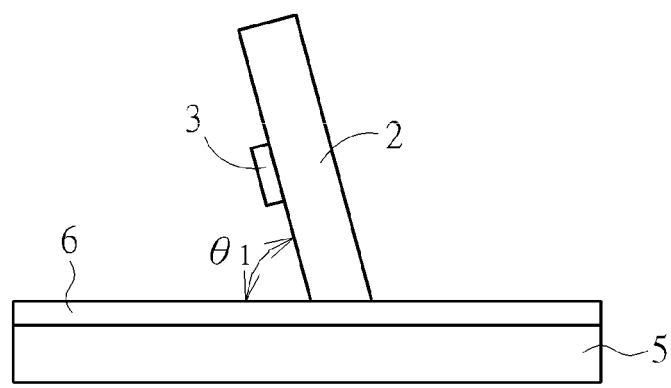
FIG. 12 is a schematic diagram illustrating a circuit board according to a preferred embodiment of the present invention.

Please refer to FIG. 12. The supporting base 5 of the illumination device 11 in the present invention may further include a circuit board 6 electrically coupled to a power supply. The circuit board 6 is electrically coupled to a first connecting conductor and a second connecting conductor (not shown in FIG. 12) so as to be electrically connected to the LED structure 3. The power supply may then provide electricity to the LED ship 3 for emitting light via the circuit board 6. In other preferred embodiment of the present invention, the LED structure 3 may also be electrically connected to the supporting base directly via the first connecting conductor and the second connecting conductor (not shown in FIG. 12) without the circuit board 6, and the power supply may provide electricity to the LED ship 3 via the supporting base 5.

Figure 13:
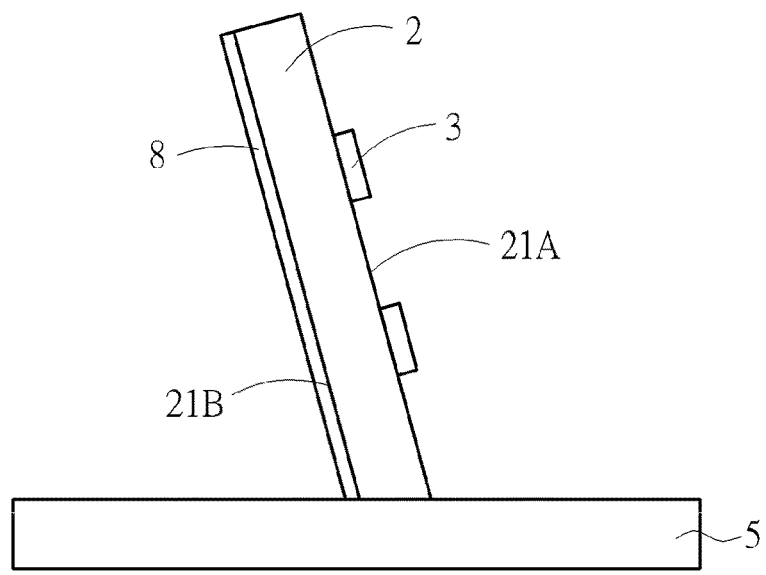
FIG. 13 is a schematic diagram illustrating a reflector according to a preferred embodiment of the present invention.

Please refer to FIG. 13. The illumination device 11 of the present invention may further include a reflector or filter 8 disposed on the second main surface 21B or the support surface 210. The reflector or filter 8 may be used to reflect at least a part of light beams emitted from the LED structure 3 and passing through the transparent substrate 2. At least a part of the reflected light beams may be changed to be emitted from the first main surface 21A. The reflector 8 may include at least one metal layer or a Bragg reflector, but not limited thereto. The Bragg reflector may be composed of a plurality of insulating thin films with different refractive indexes disposed in a stack configuration, or the Bragg reflector may be composed of a plurality of insulating thin films with different refractive indexes and a plurality of metal oxide layers disposed in a stack configuration.

Figure 14:
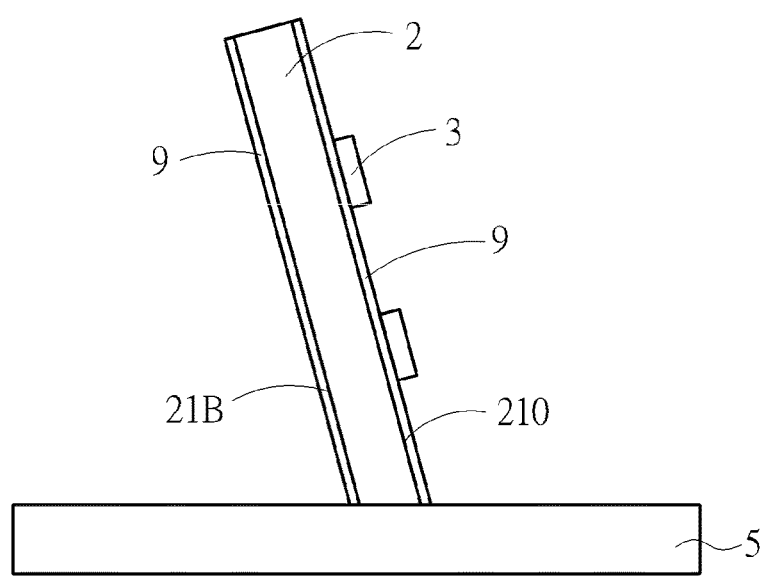
FIG. 14 is a schematic diagram illustrating a diamond-like carbon film according to a preferred embodiment of the present invention.

Please refer to FIG. 14. The illumination device 11 of the present invention may further include a diamond-like carbon (DLC) film 9 disposed on the support surface 210 or/and the second main surface 21B of the transparent substrate 2 so as to enhance the thermal conductive ability and the heat dissipating performance.

Figure 15:
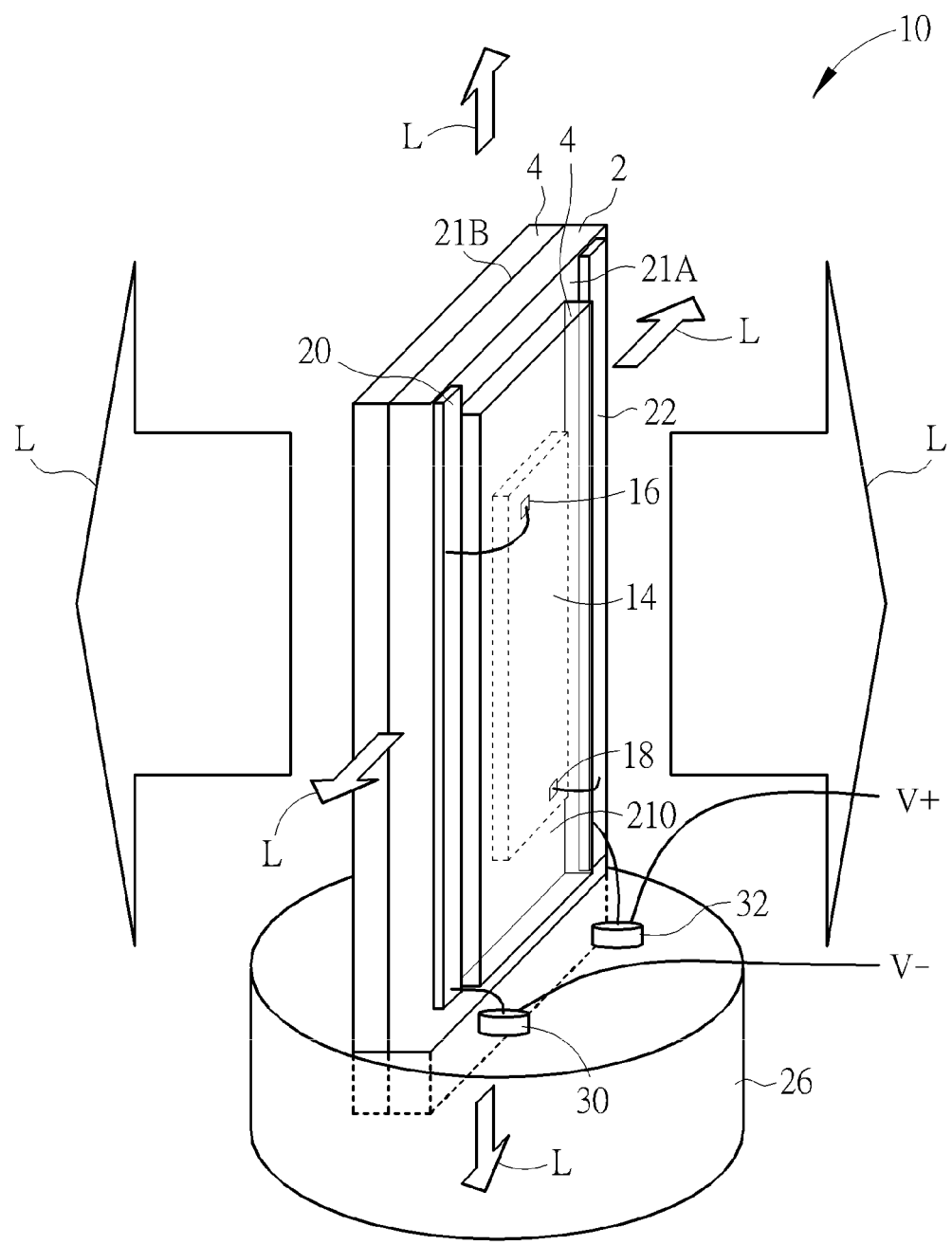
FIG. 15 is a schematic diagram illustrating an illumination device according to another preferred embodiment of the present invention.

Please refer to FIG. 15. FIG. 15 is a schematic diagram illustrating an illumination device according to another preferred embodiment of the present invention. As shown in FIG. 15, an illumination device 10 in this embodiment includes a supporting base 26 and the semiconductor light emitting element described in the present invention. The semiconductor light emitting element includes a transparent substrate 2 and at least one LED structure 14. The semiconductor light emitting element may be at least partially embedded into the supporting base 26. An electrode 30 and an electrode 32 of the supporting base 26 are electrically connected to the connecting conductors of the semiconductor light emitting element. Driving voltage V+ and V− may be accordingly provided through the electrodes 30 and 32 respectively to the LED structure 14 for emitting the light beam L. The LED structure 14 includes a first electrode 16 and a second electrode 18 respectively and electrically connected to the first connecting conductor 20 and the second connecting conductor 22 by wire bonding, but not limited thereto. Additionally, the LED structure 14 has a beam angle greater than 180 degrees or has a plurality of light emitting surfaces, and then the illumination device 10 may emit light beams from the first main surface 21A and the second main surface 21B. Furthermore, because some of the light beams may be emitted directly from the LED structure 14 and/or the other four side surfaces of the transparent substrate 2, the illumination device 10 may accordingly emit light from multi sides or six sides or in full directions.

The semiconductor light emitting element may further include a wavelength conversion layer 4 selectively disposed on the LED structure 14, the first main surface 21A or the second main surface 21B. The wavelength conversion layer 4 may at least partially absorb a light beam emitted from the LED structure 14 and covert the light beam into another light beam having different wavelength range so as to emit light with specific color or light having a wider wavelength range from the illumination device 10. For example, when blue light beams are emitted from the LED structure 14, a part of the blue light beams may be converted into yellow light beams by the wavelength conversion layer 4, and the blue light beams and the yellow light beams may be mixed for presenting white light beams emitted from the illumination device 10. Additionally, the transparent substrate 2 may be directly or indirectly fixed on the supporting base 26 in a parallel state or a non-parallel state. For instance, the transparent substrate 2 may be vertically fixed on the supporting base 26 by mounting a side wall of the transparent substrate 2 with the supporting base 26 directly, or the transparent substrate 2 may be horizontally disposed on the supporting base 26, but not limited thereto. The transparent substrate 2 preferably includes materials with high thermal conductivity, and heat generated from the LED structure 14 may be accordingly dissipated to the supporting base 26 through the transparent substrate 2, such that the high power LED structures can be applied in the illumination device of the present invention accordingly. However, in a preferred embodiment of the present invention, at the same power consumption of the illumination device, more LED structures with relatively low power are dispersed on the transparent substrate 2 so as to fully utilize the thermal conductivity capability of the transparent substrate 2. For example, a power of the LED structure in this embodiment may be equal to or lower than 0.2 watt, but not limited thereto.

Figure 16:
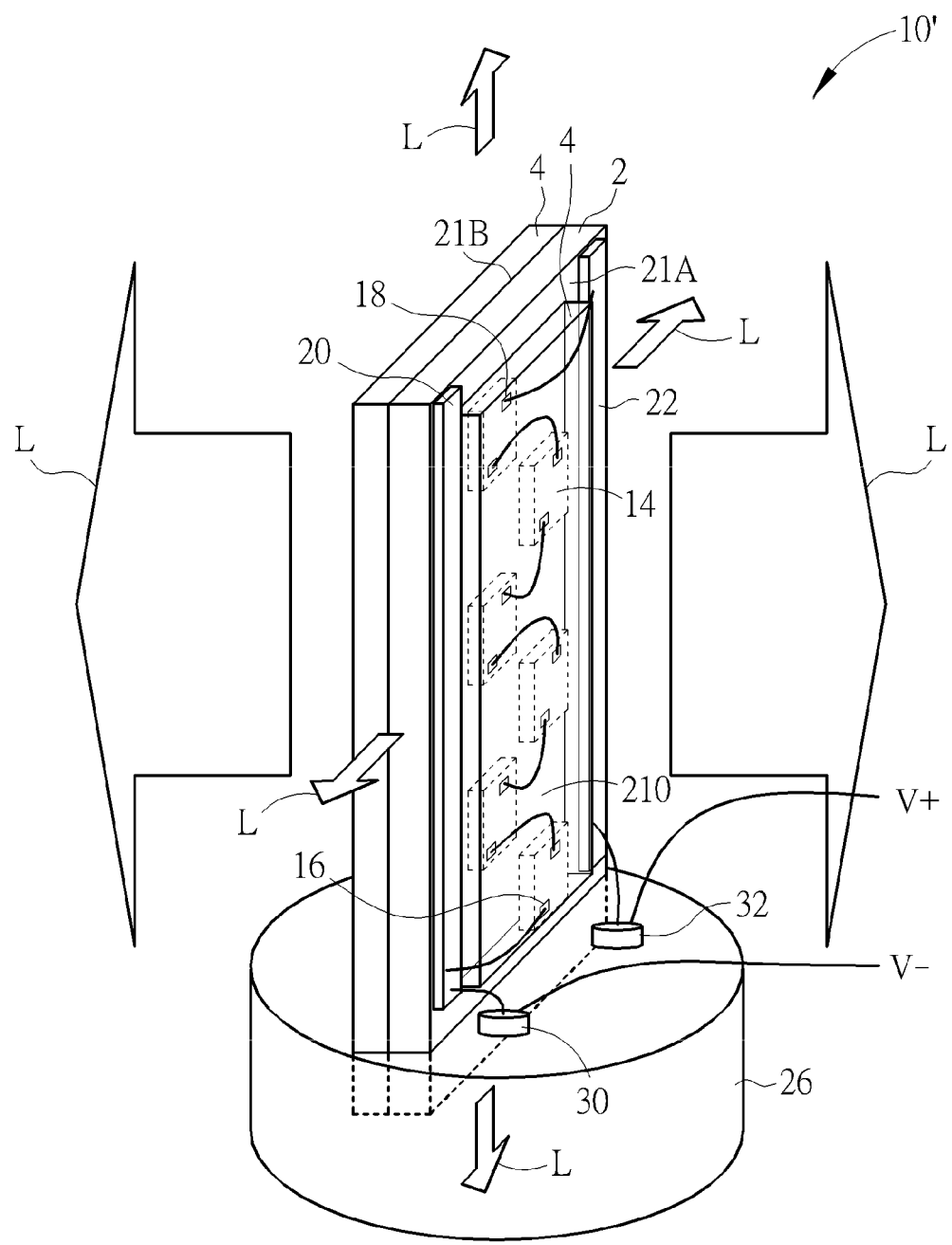
FIG. 16 is a schematic diagram illustrating an illumination device according to another preferred embodiment of the present invention.

Please refer to FIG. 16. FIG. 16 is a schematic diagram illustrating an illumination device according to another preferred embodiment of the present invention. Compared with the illumination shown in FIG. 15, an illumination device 10' in this embodiment includes a plurality of LED structures 14, and at least some of the LED structures 14 are electrically connected to each other in series. Each of the LED structures 14 includes the first electrode 16 and the second electrode 18. The first electrode 16 of one LED structure 14 disposed on one end of the series is electrically connected to the first connecting conductor 20, and the second electrode 18 of another LED structure 14 disposed on another end of the series is electrically connected to the second connecting conductor 22, but not limited thereto. The LED structures 14 may be electrically connected in series or in parallel. The LED structures 14 may be LED structures emitting identical color, such as blue LED structures, or LED structures emitting different colors may also be applied and combined according to different demands. The illumination device 10' may emit light in much more different colors by further employing the wavelength conversion layer 4 according to the present invention.

Figure 17:
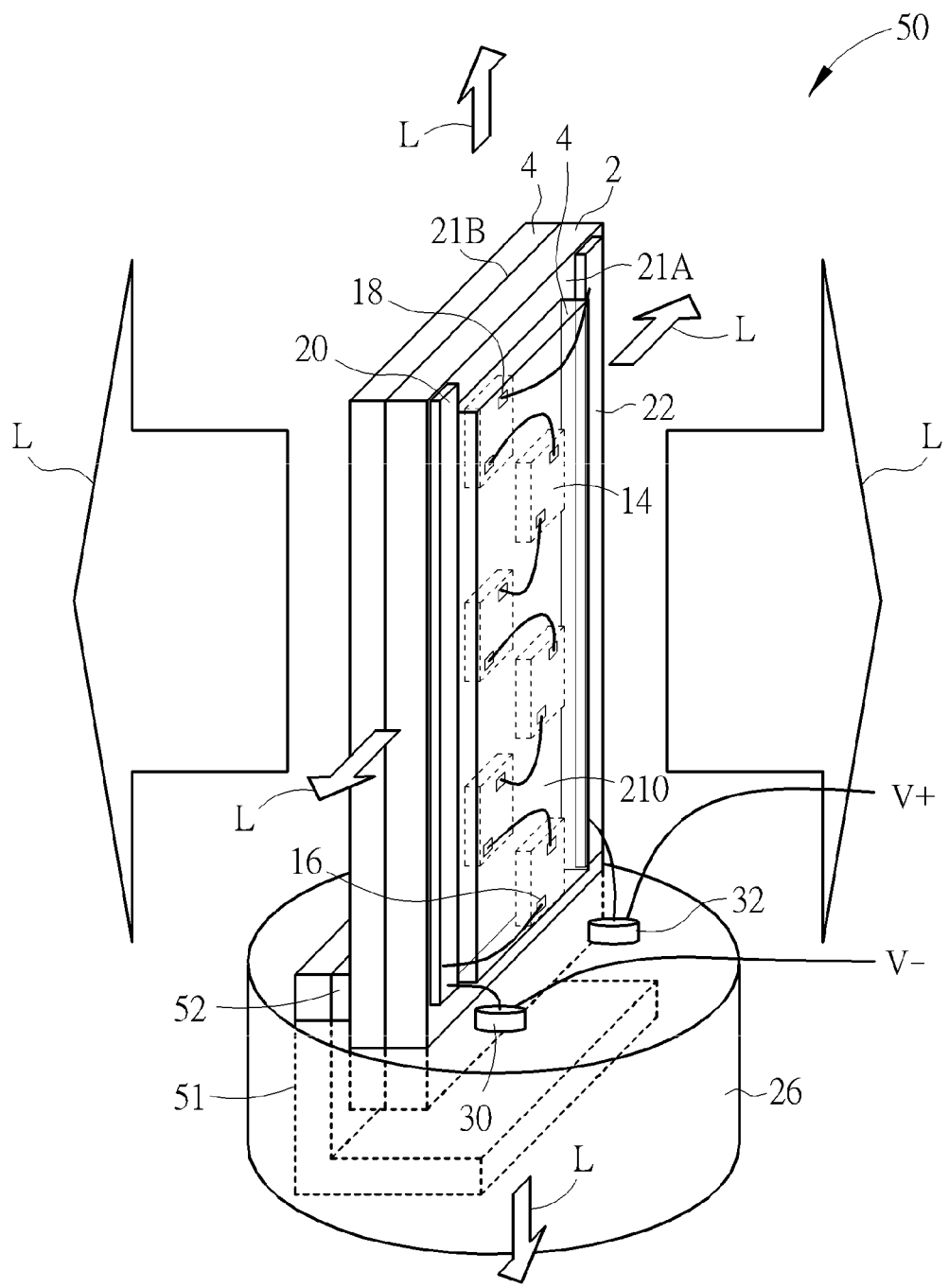
FIG. 17 is a schematic diagram illustrating an illumination device according to another preferred embodiment of the present invention.

Please refer to FIG. 17. FIG. 17 is a schematic diagram illustrating an illumination device according to another preferred embodiment of the present invention. Compared with the illumination devices shown in FIG. 15 and FIG. 16, an illumination device 50 in this embodiment further includes a support 51 configured to connect the semiconductor light emitting element and the supporting base 26. The transparent substrate 2 of the semiconductor light emitting element is fixed on a side of the support 51 by a unit bonding layer 52, and another side of the support 51 may be disposed on or inserted into the supporting base 26. Additionally, the support 51 is flexible so as to form an angle between the transparent substrate 2 and the supporting base 26, and the angle ranges from 30 degrees to 150 degrees. A material of the support 51 may include one selected from aluminum, composite metallic material, copper conductor, electric wire, ceramic substrate, printed circuit board, or other appropriate materials.

Figures 18, 19:
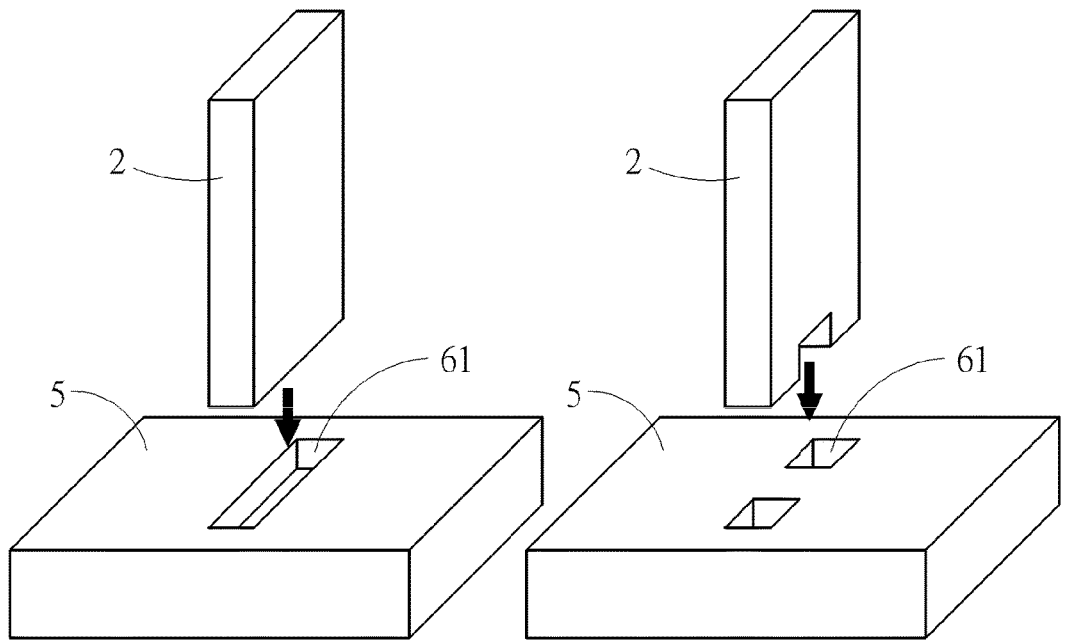
FIGS. 18-20 are schematic diagrams illustrating a transparent substrate inserted or bonded to a supporting base according to a preferred embodiment of the present invention.
Figure 20:
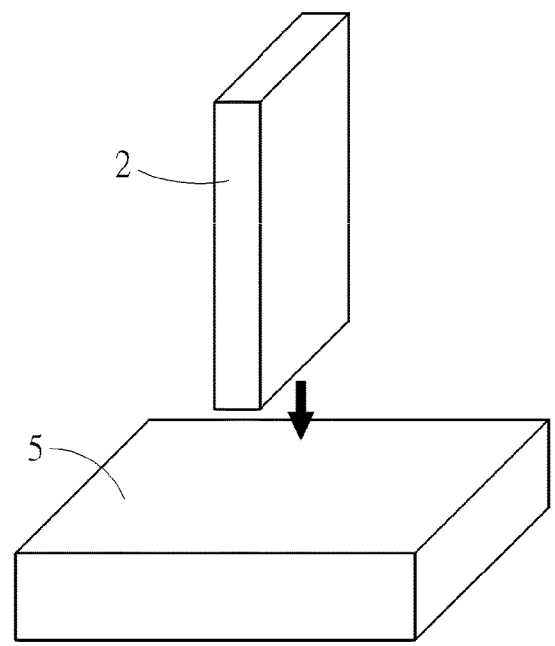

Please refer to FIGS. 18-20. When the transparent substrate 2 in the present invention is disposed on a supporting base 5, the transparent substrate 2 may be inserted or bonded to the supporting base 5.

As shown in FIG. 18. When the transparent substrate 2 is disposed on the supporting base 5, the transparent substrate 2 is inserted in to a single socket 61 of the supporting base 5, and the semiconductor light emitting element may be electrically coupled to the single socket 61 via connecting conductors. The LED structures (not shown in FIG. 18) on the transparent substrate 2 have to be electrically coupled to a power supply from or through the supporting base 5, and at least part of the conductive pattern or the connecting conductors are extended to an edge of the transparent substrate 2 and integrated in to an connecting finger having a plurality of conductive contact sheets or an electrically connecting port such as the connecting electrodes 311A and 311B described above (not shown in FIG. 18). When the transparent substrate 2 is inserted into the socket 61, the LED structure (not shown in FIG. 18) may then receive electricity from or through the supporting base 5, and the transparent substrate 2 may be fixed by the socket 61 of the supporting base 5 accordingly.

Please refer to FIG. 19. FIG. 19 is a schematic diagram illustrating the transparent substrate 2 inserted into a multi sockets of the supporting base 5. In this embodiment, the transparent substrate 2 has a dual-pin structure. One of the pins may be configured as a positive electrode of the device, and another one of the pins may be configured as a negative electrode of the device. Both of the pins have at least one conductive contact sheet respectively so as to act as connecting ports. Accordingly, there are at least two sockets 61 having corresponding shape and size with the pins so as to smoothly insert the transparent substrate 2 into the supporting base 5 and provide electricity to the LED structure.

Please refer to FIG. 20. The transparent substrate 2 is bonded to the supporting base 5 by the device bonding layer. In the bonding process, metal materials such as gold, tin, indium, bismuth or silver may be used in combining or welding the transparent substrate 2 and the supporting base 5. Additionally, conductive silica gel or epoxy material may also be used in fixing the transparent substrate 2 on the supporting base 5. The conductive pattern and the connecting conductors of the semiconductor light emitting element may be electrically connected to the supporting base via the device bonding layer accordingly.

Figure 21:
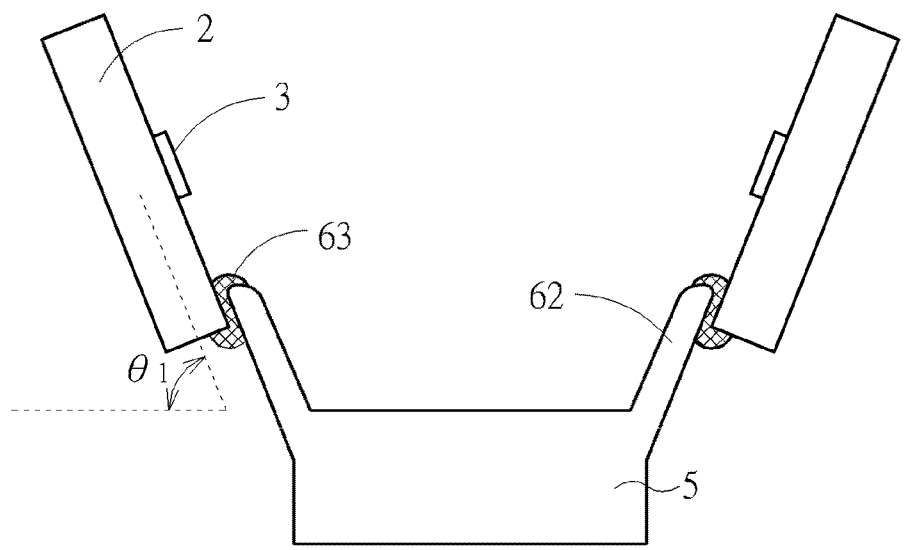
FIG. 21 and FIG. 22 are schematic diagrams illustrating a transparent substrate bonded to a supporting base with supports according to a preferred embodiment of the present invention.
Figure 22:
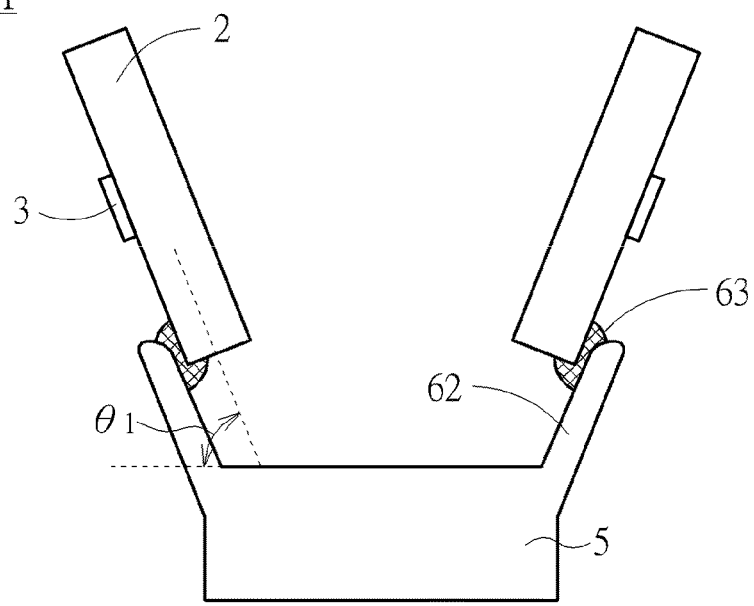

Please refer to FIG. 21 and FIG. 22. The supporting base 5 of the illumination device 11 described in the present invention may be a substrate comprising one selected from metal such as aluminum, composite metallic material including aluminum, copper conductor, electric wire, ceramic substrate or printed circuit board. There is at least one support 62 on a surface or edge of the supporting base 5. The support 62 may be separated from the supporting base 5, or the support 62 and the supporting base 5 are monolithically integrated. The semiconductor light emitting element may be electrically coupled to the support 62 by bonding, and a device bonding layer 63 is used to fix the transparent substrate 2 on the supporting base 5. The first angle θ1 is maintained between the transparent substrate 2 and a surface of the supporting base 5 without supports. The semiconductor light emitting elements may also be disposed on the surface of the supporting base 5 without supports so as to enhance the light emitting performance of the illumination device 11. Additionally, the semiconductor light emitting element may also be inserted and connected to the support 62 (not shown in FIG. 21 and FIG. 22), wherein a connector may be used to connect the semiconductor light emitting element and the support (and/or the support and the supporting base) so as to fix the transparent substrate 2 on the supporting base 5. Because the supporting base 5 and the support 62 are flexible, it is more convenient to apply the present invention to different applications. Moreover, the color variety of the illumination device 11 may be enhanced for different demands by combining using the semiconductor light emitting elements having different light color.

Figure 23:
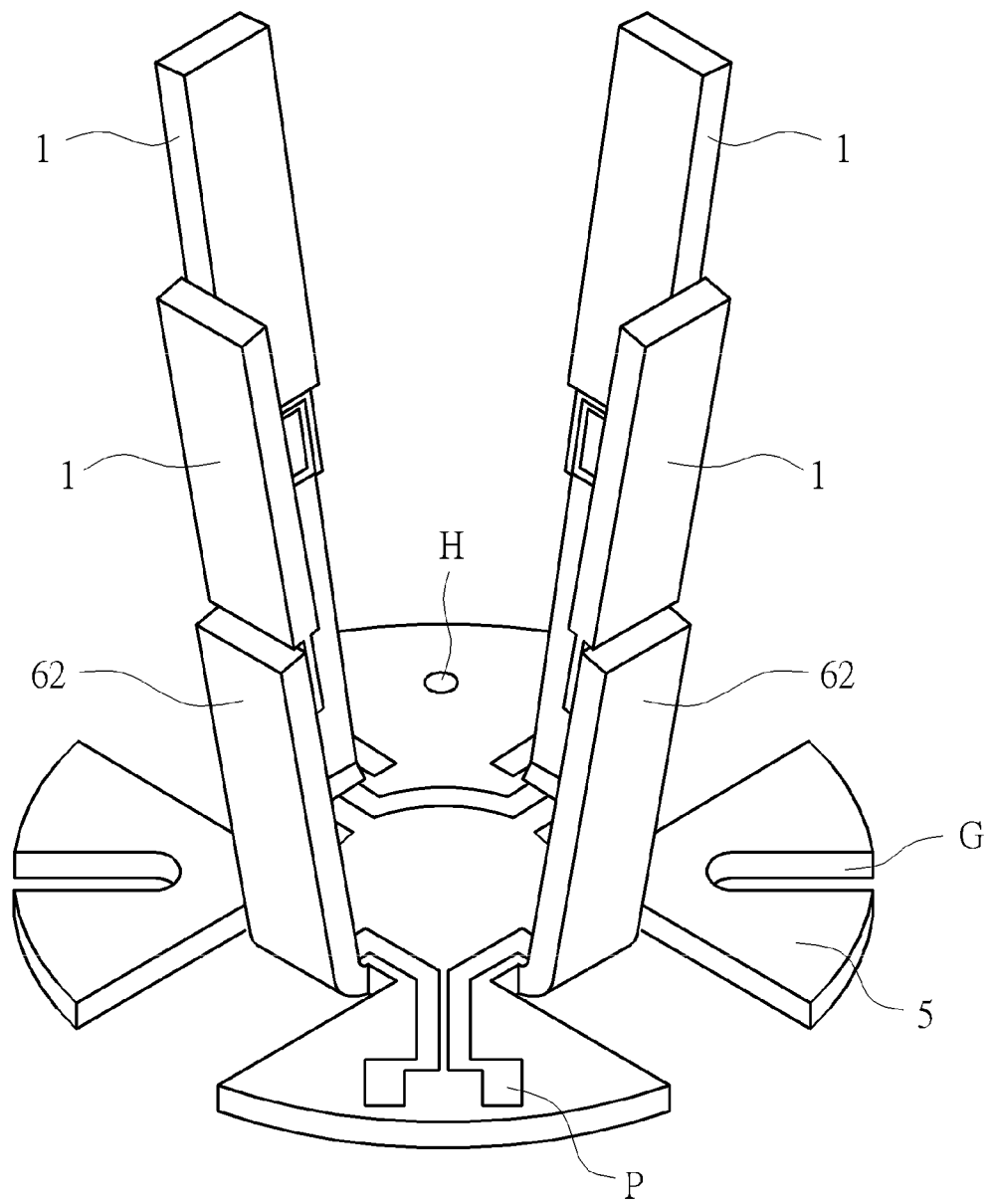
FIG. 23 is a schematic diagram illustrating an illumination device according to another preferred embodiment of the present invention.

Please refer to FIG. 23. As shown in FIG. 23, an illumination device in this embodiment includes at least one semiconductor light emitting element 1 and a supporting base 5. The supporting base 5 includes at least one support 62 and at least one circuit pattern P. An end of the transparent substrate of the semiconductor light emitting element 1 is electrically coupled to the support 62 so as to avoid or reduce the shielding influence caused by the support 62 for light emitting from the semiconductor light emitting element 1. The supporting base 5 may be selected from metal such as aluminum, composite metallic material including aluminum, copper conductor, electric wire, ceramic substrate or printed circuit board. The support 62 may be formed by cutting and bending a part of the supporting base 5 to form an angle (as the first angle θ1 shown in FIG. 21 and FIG. 22). The circuit pattern P is disposed on supporting base 5, and the circuit pattern P has at least one set of electrical port to be electrically connected to a power supply. Another part of the circuit pattern P extends on the support 62 so as to be electrically connected to the semiconductor light emitting element 1, and the semiconductor light emitting element 1 may than be electrically connected to the power supply via the circuit pattern P of the supporting base 5. In addition, the supporting base 5 may further include at least one hole H or at least one gap G, and fixing devices such as screws, nails or bolts may be used to combine the supporting base 5 with other device via the hole H or the gap G according to the application conditions of the illumination device. Meanwhile, the hole H or the gap G may also be used to increase the heat radiating area and enhance the heat dissipation capability of the illumination device.

Figure 24:
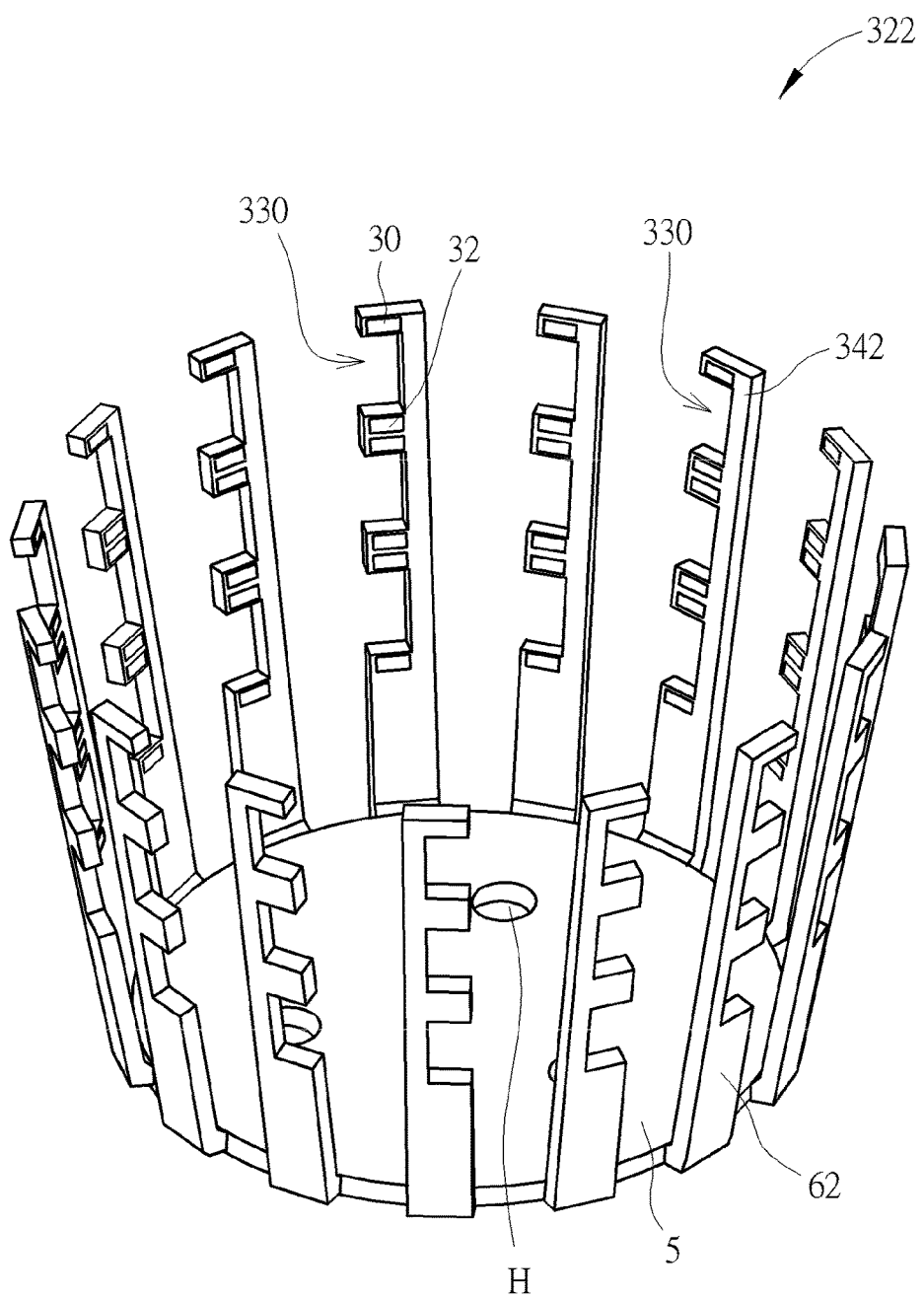
FIG. 24 is a schematic diagram illustrating a device frame of an illumination device according to another preferred embodiment of the present invention.

Please refer to FIG. 24. FIG. 24 is a schematic diagram illustrating a device frame of an illumination device according to another preferred embodiment of the present invention. As shown in FIG. 24, a device frame 322 in this embodiment includes a supporting base 5 and at least one support 62. Compared with the embodiment shown in FIG. 23, the support 62 in this embodiment includes at least one stripe part 342 and an opening 330. The electrode 30 and the electrode 32 are respectively disposed on two sides of the opening 330. The stripe part 342 forms at least one wall of the opening 330. One semiconductor light emitting element described in the present invention is disposed correspondingly to the opening 330 and electrically coupled to the support 62. The connecting conductors of the semiconductor light emitting element is electrically connected to the electrode 30 and the electrode 32 so as to drive the semiconductor light emitting element by a power supply via the support 62 and the circuit pattern on the supporting base 5. A size of the opening 330 may not be smaller than a main light emitting surface of the semiconductor light emitting element so as to prevent light beams emitted from the semiconductor light emitting element from being blocked by the support 62. A connection part between the support 62 and the supporting base 5 may be adjustable so as to adjust the angle between the support 62 and the supporting base 5 as required.

Figure 25:
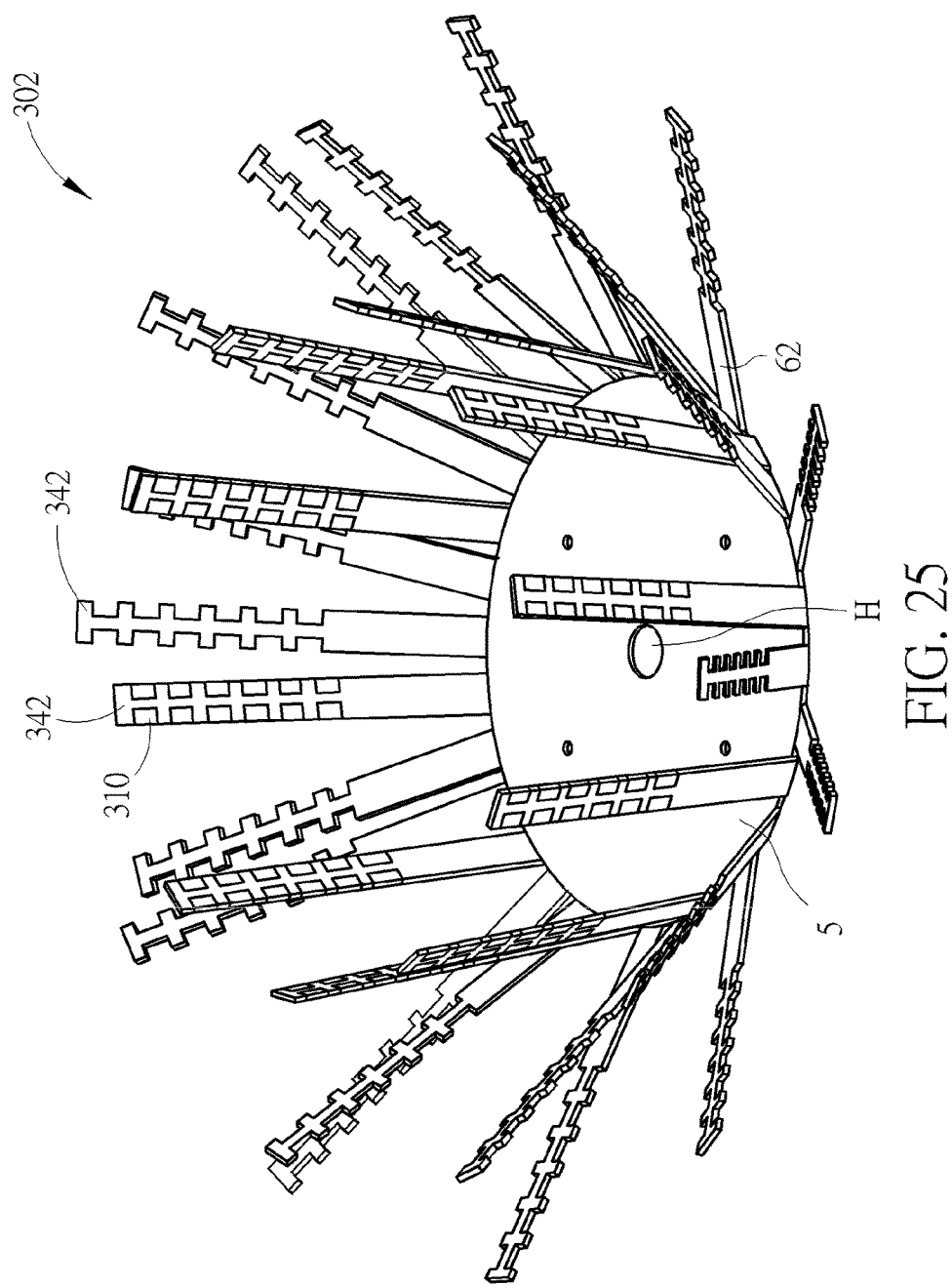
FIG. 25 is a schematic diagram illustrating an illumination device according to another preferred embodiment of the present invention.

Please refer to FIG. 24 and FIG. 25. FIG. 25 is a schematic diagram illustrating an illumination device according to another preferred embodiment of the present invention. Compared with the embodiment shown in FIG. 24, an illumination device 302 shown in FIG. 25 further includes at least one support 62 having a plurality of openings 330. The openings 330 are respectively disposed on two opposite sides of the support 62, and the stripe part 342 forms at least one wall of each opening 330. The semiconductor light emitting element 310 are disposed correspondingly to the openings 330, and the conductive pattern or the connecting electrodes (not shown in FIG. 25) of each semiconductor light emitting element 310 are respectively disposed correspondingly and electrically connected to the electrode 30 and 32. The illumination device 302 in this embodiment may further include a plurality of the supports 62. The support 62 is disposed between the semiconductor light emitting element 1 and the supporting base 5. A length of the support 62 may substantially range from 5.8 to 20 um. Angles between the supporting base 5 and the supports 62 with the semiconductor light emitting element disposed on may be modified respectively. In other words, an angle between the supporting base 5 and at least one of the supports 62 may be different from an angle between the supporting base 5 and another one of the supports 62 so as to perform required light emitting effects, but not limited thereto. Additionally, semiconductor light emitting elements emitting light having different wavelength ranges may be disposed on an identical support or on different supports so as to enrich the color effect of the illumination device.

Figure 26:
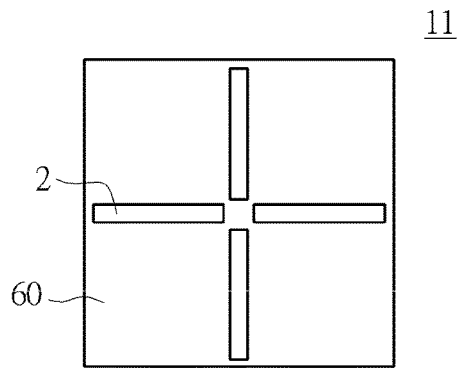
FIGS. 26-29 are schematic diagrams illustrating transparent substrates point-symmetrically or line-symmetrically disposed on a supporting structure according to a preferred embodiment of the present invention.
Figure 27:
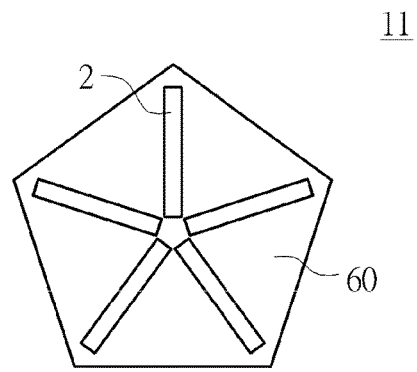
Figure 28:
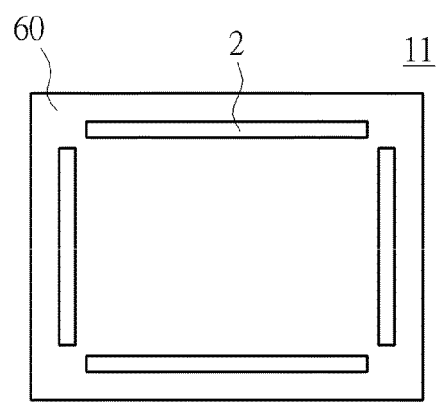
Figure 29:
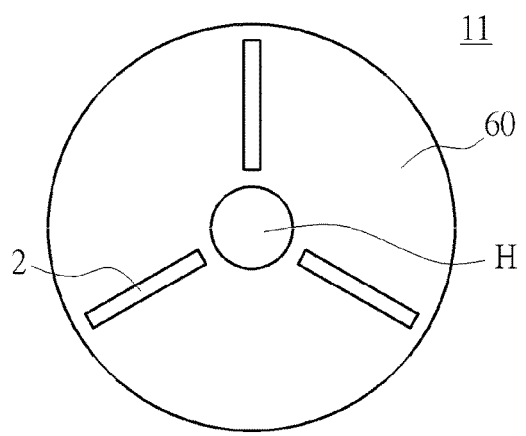

For enhancing the luminance and improving the light emitting effect, in an illumination device of another preferred embodiment of the present invention, a plurality of the semiconductor light emitting elements comprising the transparent substrates are disposed on the supporting bases detailed above or on other supporting structures. A point-symmetric distribution or a line-symmetric distribution may be applied. The semiconductor light emitting elements comprising the transparent substrates may be point-symmetrically disposed on the supporting structure or line-symmetrically disposed on the supporting structure. Please refer to FIGS. 26-29. In the illumination devices of the embodiments shown in FIGS. 26-29, the semiconductor light emitting elements are disposed on the supporting structures having different shapes. The light beams emitted from the illumination devices 11 may be uniform because of the point-symmetric distribution or the line-symmetric distribution (the LED structures are not shown in FIGS. 26-29). The light emitting effects of the illumination devices 11 may be further improved by adjusting the first angle described above. As shown in FIG. 26, the semiconductor light emitting elements are point-symmetrically arranged and form an angle between each other in 90 degrees. Therefore, at least two of the semiconductor light emitting elements may face any one of the four sides of the illumination device 11. As shown in FIG. 27, the angle between the semiconductor light emitting elements is smaller than 90 degrees. As shown in FIG. 29, the angle between the semiconductor light emitting elements is larger than 90 degrees. In another preferred embodiment of the present invention (not shown), the semiconductor light emitting elements may be asymmetrically disposed and at least a part of the semiconductor light emitting elements may be disposed in a crowd or separately disposed so as to perform required light shape according to different applications of the illumination device.

Figure 30:
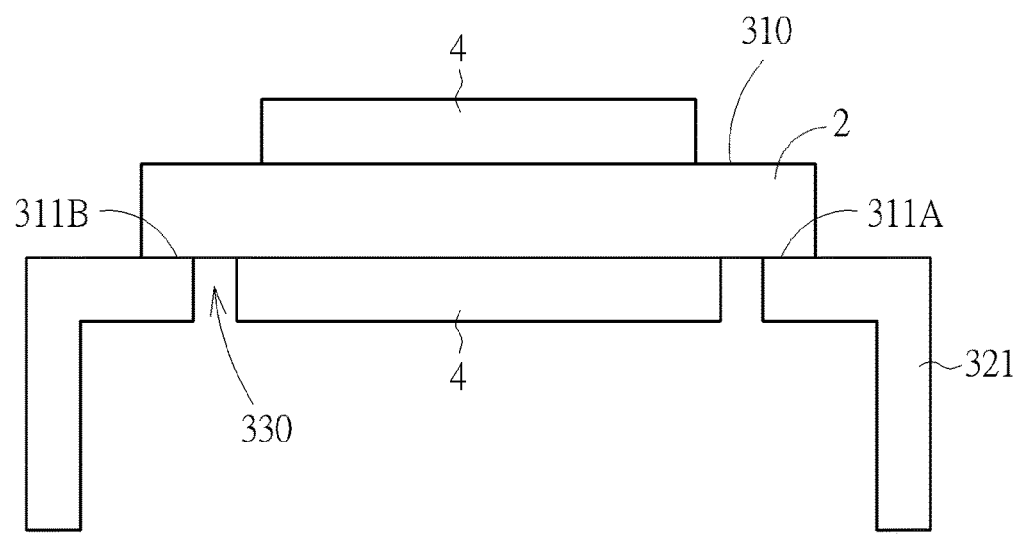
FIG. 30 is a schematic diagram illustrating an illumination device according to another preferred embodiment of the present invention.

Please refer to FIG. 30. FIG. 30 is a schematic diagram illustrating an illumination device according to another preferred embodiment of the present invention. As shown in FIG. 30, an illumination device 301 includes a semiconductor light emitting element 310 and a support 321. The support 321 includes an opening 330, and the semiconductor light emitting element 310 is disposed correspondingly to the opening 330. In this embodiment, an external part of the support 321 may be work as a pin or be bent to form a connecting pad required in surface mounting so as to be fixed and electrically connected to other electrical circuit units. A light emitting surface of the semiconductor light emitting element 310 is disposed in the opening 330, and the illumination device 301 may still emit light from multi sides or six sides accordingly whether the support 321 is transparent or not.

Figure 31:
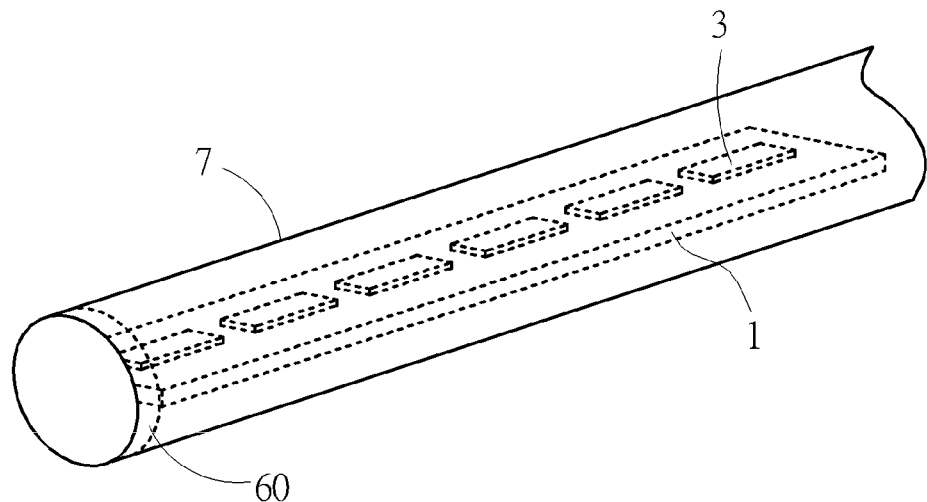
FIG. 31 and FIG. 32 are schematic diagrams illustrating a lamp housing according to a preferred embodiment of the present invention.
Figure 32:
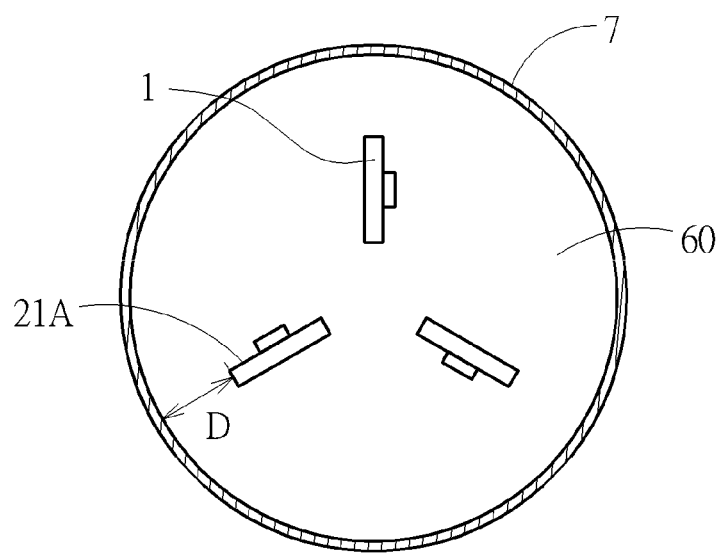

Please refer to FIG. 31. An illumination device is provided in this embodiment of the present invention. The illumination device includes a lamp housing 7 having a tube shape, at least one semiconductor light emitting element 1 and a supporting structure 60. The semiconductor light emitting element 1 is disposed on the supporting structure 60, and at least a part of the semiconductor light emitting element 1 is disposed in space formed by the lamp housing 7. Please refer to FIG. 32. When more semiconductor light emitting elements 1 are disposed in the lamp housing 7, the first main surfaces 21A of the semiconductor light emitting elements 1 are arranged separately and not parallel to one another. Additionally, the semiconductor light emitting elements 1 are at least partially disposed in space formed by the lamp housing 7, and the semiconductor light emitting elements 1 are not closely adjacent to an inner wall of the lamp housing 7. Preferably, a distance D between the semiconductor light emitting element 1 and the lamp housing 7 may be equal to or larger than 500 micrometers. However, the lamp housing 7 may also be formed by filling glue, and the lamp housing 7 may at least partially cover and directly contact the semiconductor light emitting element 1.

Figure 33:
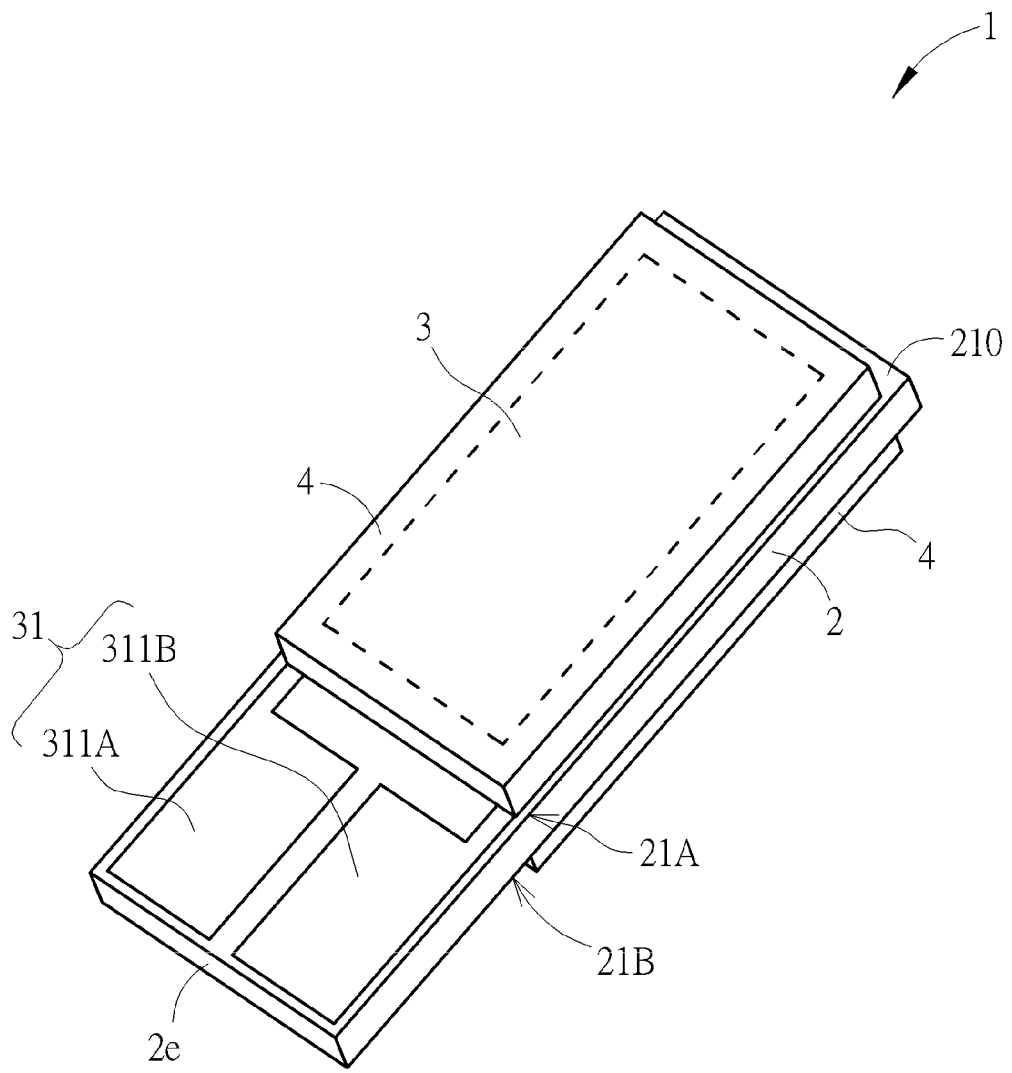
FIG. 33 is a schematic diagram illustrating a semiconductor light emitting element according to a preferred embodiment of the present invention.

Please refer to FIG. 33. FIG. 33 is a schematic diagram illustrating a semiconductor light emitting element 1 according to a preferred embodiment of the present invention. In contrast to the embodiment as shown in FIG. 10, the semiconductor light emitting element 1 in this embodiment includes a transparent substrate 2 having an extension part 2e where a set of connecting electrodes 31 is disposed on, and at lease an LED structure 3 is disposed on a position of the transparent substrate 2 opposite to the set of connecting electrodes 31. The set of connecting electrodes 31 may include a first connecting electrode 311A and a second connecting electrode 311B which are located on the same side of the semiconductor light emitting element 1 and are adapted to electrically connect the LED structure 3 and an electrical power source. The first connecting electrode 311A and the second connecting electrode 311B may respectively be a positive electrode and a negative electrode, which are utilized to electrically contact corresponding electrodes disposed on the support 62 or the base as shown in the embodiments of the present invention described above or below. Therefore, the LED structure 3 and the wavelength conversion layer 4 covered on the LED structure 3 can protrude from an edge of the support 62 or the base. Light emitted from the LED structure 3 can perform multi-directional or omni-directional illumination due to the transparent substrate 2 as described in the above embodiments of the present invention.

Figure 34:
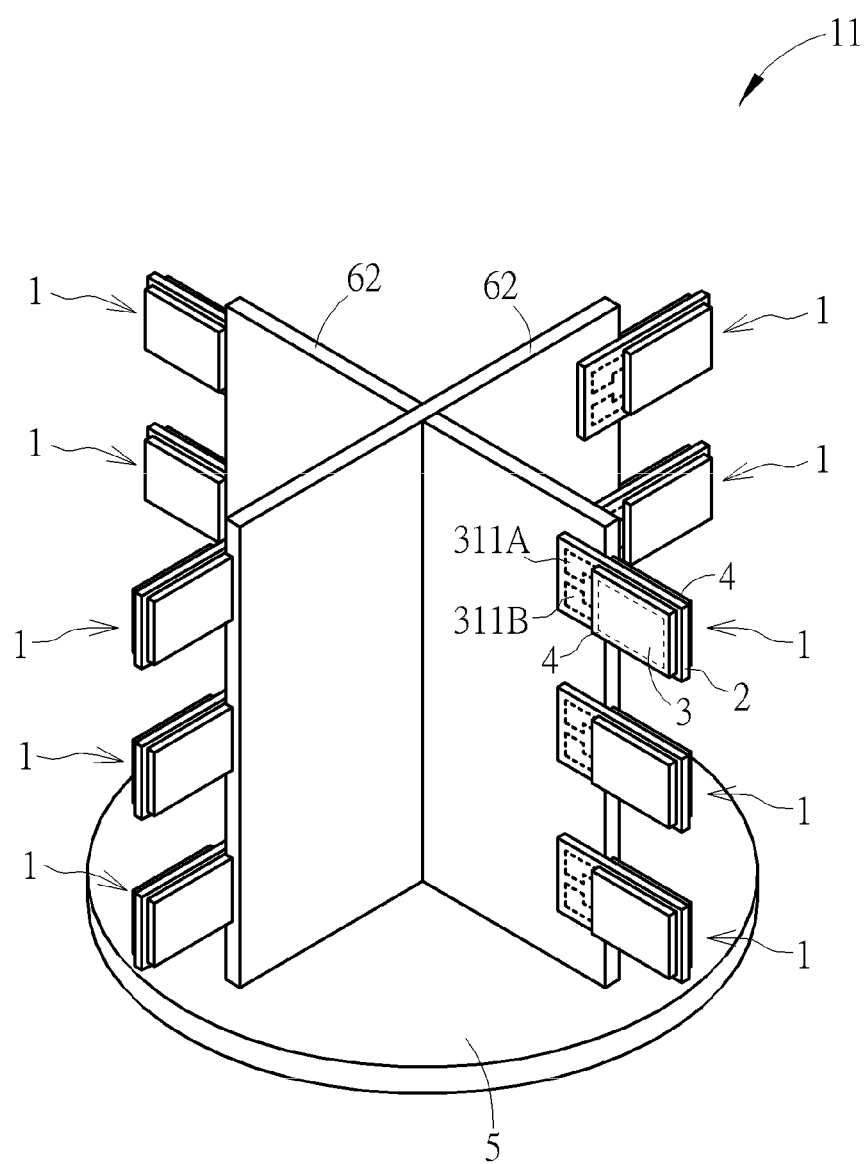
FIG. 34 is a schematic diagram illustrating an illumination device according to a preferred embodiment of the present invention.
Figure 35:
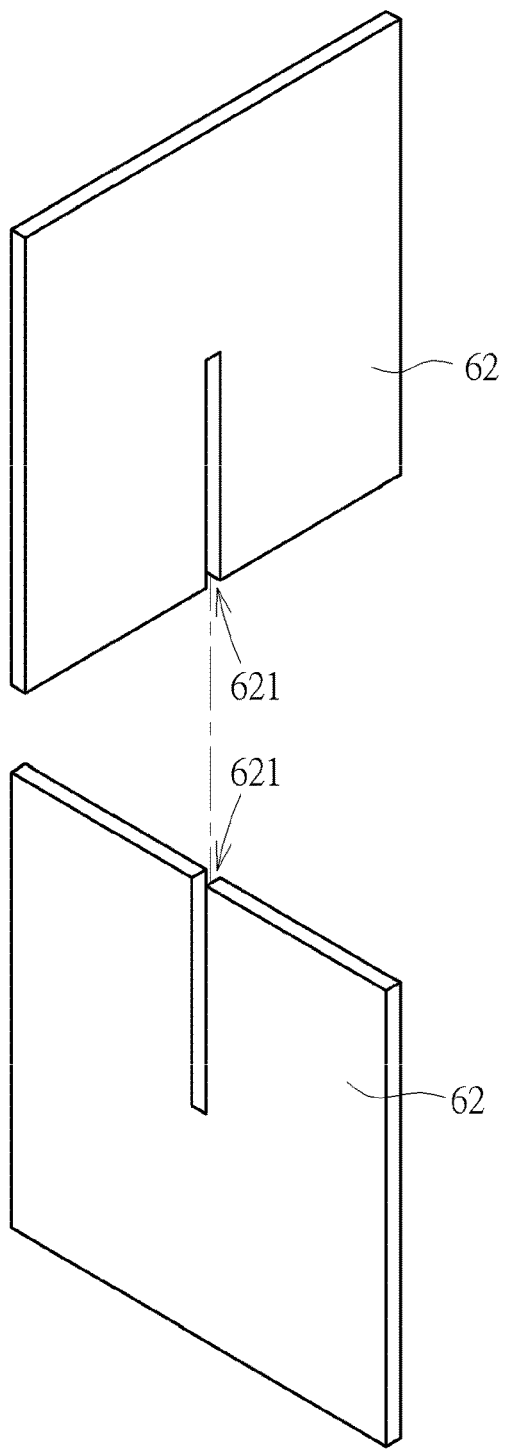
FIG. 35 is a schematic diagram illustrating an assembly of supports according to the preferred embodiment of the present invention.
Figure 36:
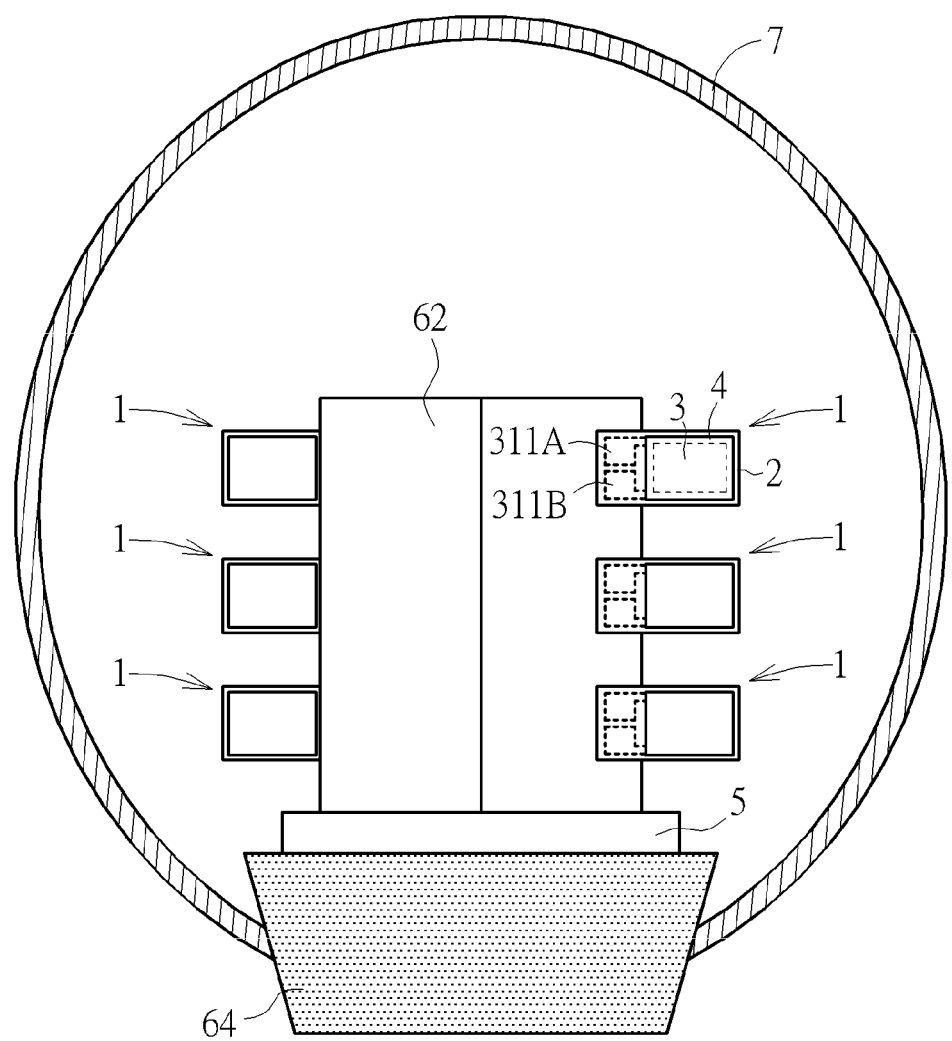
FIG. 36 is a schematic diagram illustrating an illumination device with a lamp housing according to the preferred embodiment of the present invention.

Please refer to FIG. 34 to FIG. 36. FIG. 34 is a schematic diagram illustrating an illumination device 11 according to a preferred embodiment of the present invention. FIG. 35 is a schematic diagram illustrating an assembly of the supports 62 according to the preferred embodiment of the present invention. FIG. 36 is a schematic diagram illustrating the illumination device 11 with a lamp housing 7 according to the preferred embodiment of the present invention. As shown in FIG. 34, the illumination device 11 includes a supporting base 5, at least two supports 62 disposed on the supporting base 5 and coupled to each other, and at least two semiconductor light emitting elements 1 coupled to the corresponding supports 62. At least one of the supports 62 may have a slot 621 and another one of the supports 62 can be inserted into the slot 621, so that the two supports 62 are coupled to each other via the slot 621. Further, as shown in FIG. 35, two of the supports 62 can respectively have the slot 621 to couple to each other by engagement of the two slots 621. An upper edge and a low edge of one of the coupled supports 62 can respectively align with an upper edge and a low edge of the other coupled support 62, so that the two supports 62 can be regularly and symmetrically disposed on the supporting base 5.

The shape of at least one of the supports 62 may be the same as or similar to a board or a sheet, which may include two parallel flat surfaces having an area which is not smaller than an area of the semiconductor light emitting element 1. According to the embodiment, preferably, the area of the support 62 may be 3 times bigger than the area of the semiconductor light emitting element 1, so that the illumination device 11 may have preferable heat dispersion function and lighting effect. A plurality of the semiconductor light emitting elements 1 may be coupled to the corresponding supports 62 in symmetry or asymmetry. According to the embodiment as shown in FIG. 34, the semiconductor light emitting element 1 disposed on one of the supports 62 is aligned to the semiconductor light emitting element 1 disposed on another one of the supports 62. But according to some other embodiments of the present invention, the semiconductor light emitting element 1 disposed on one of the supports 62 may be misalignedly or interlacedly disposed corresponding to another semiconductor light emitting element 1 disposed on another one of the supports 62 to compensate the shadow effect when lighting. As shown in FIG. 36, the illumination device 11 may further include a base 64 where the supporting base 5 is disposed on, and a lamp housing 7 with ball shape or candle shape covers the supporting base 5 and is connected with the base 64. According to the embodiment as shown in FIG. 36, a plurality of the semiconductor light emitting elements 1 are dispersedly arranged on the supports 62, and the supports 62 respectively point toward different orientations, so that the illumination device 11 with the lamp housing 7 can uniformly provide omni-directional light emitting function. Light intensity of the illumination device 11 can be adjusted by decrease or increase of the amount of the semiconductor light emitting element 1. The support 62 may be made of heat dissipating material to dissipate heat conducted from the semiconductor light emitting element 1. The material of at least one of the supports 62 is selected from print circuit board, ceramic, metal, glass, plastic or combinations. Preferably, the material of at least one of the supports 62 may be the metal core print circuit board.

Figure 37:
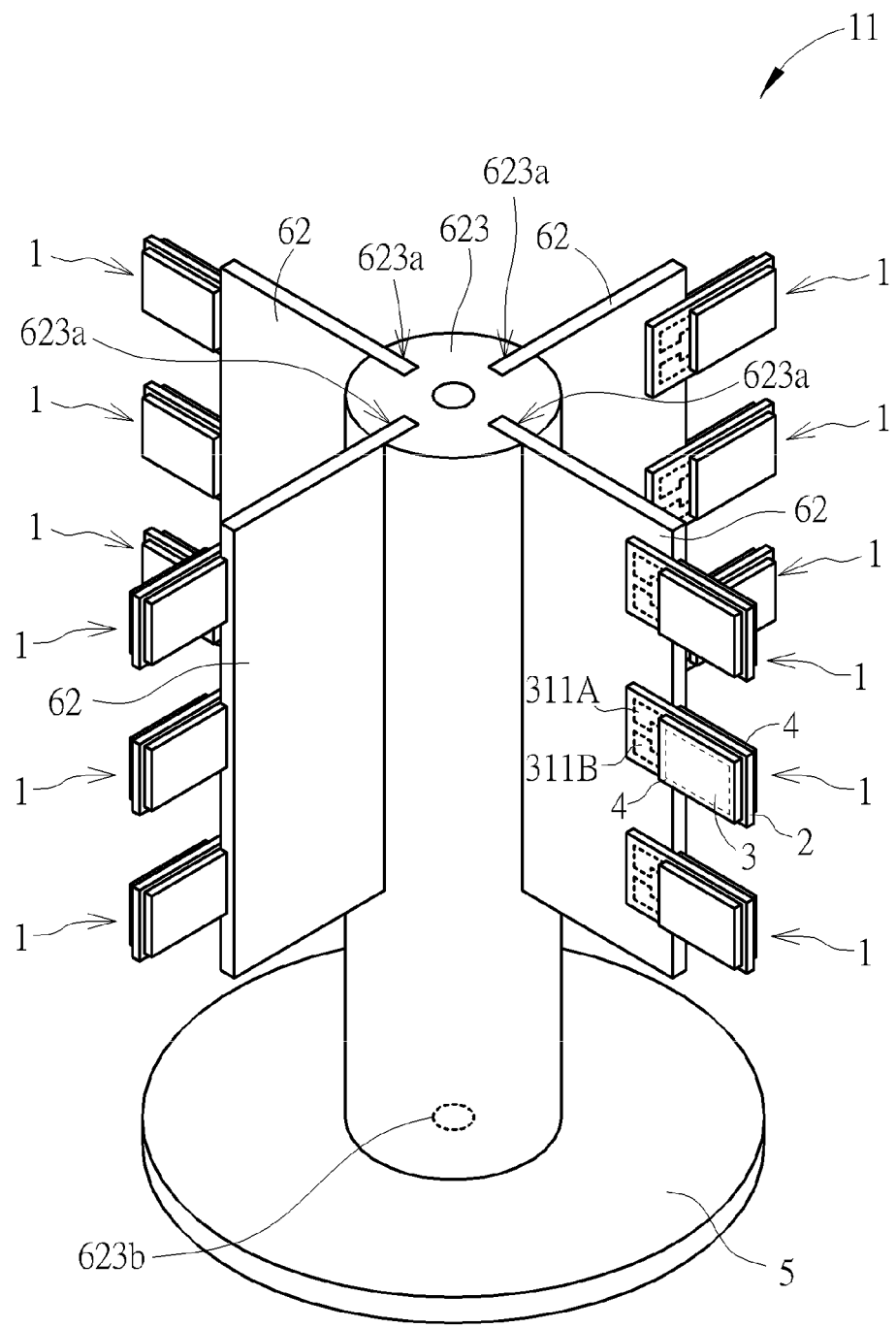
FIG. 37 is a schematic diagram illustrating an illumination device according to another preferred embodiment of the present invention.
Figure 38:
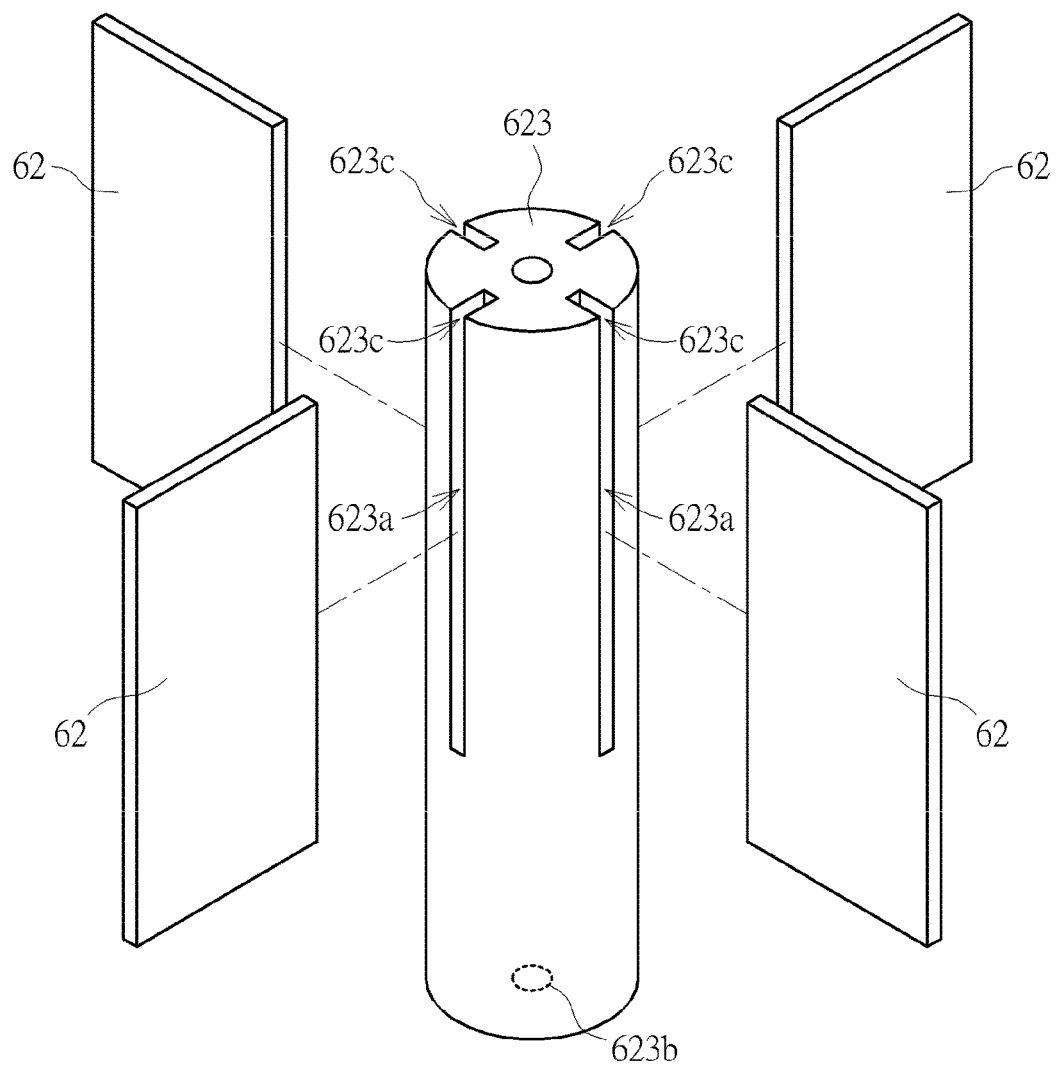
FIG. 38 is a schematic diagram illustrating an assembly of a support and a pillar according to the preferred embodiment of the present invention.

Please refer to FIG. 37 and FIG. 38. FIG. 37 is a schematic diagram illustrating an illumination device 11 according to another preferred embodiment of the present invention. FIG. 38 is a schematic diagram illustrating an assembly of a support 62 and a pillar 623 according to the preferred embodiment of the present invention. In contrast to the embodiment shown in FIG. 34, the illumination device 11 according to this embodiment as shown in FIG. 37 further includes the pillar 623, and at least one of the supports 62 may be coupled to the pillar 623. As shown in the figure, the pillar 623 may have at least an engaging slot 623a, such that the support 62 can be coupled to the pillar 623 by inserting the support 62 into the engaging slot 623a of the pillar 623. According to the embodiment, a plurality of supports 62 may be inserted into the corresponding engaging slots 623a around the pillar 623, in symmetry or asymmetry, and the illumination device 11 can uniformly provide omni-directional light emitting function.

The pillar 623 may be shaped the same as or similar to a pipe that has a guiding hole 623b disposed on at least one end surface of the pillar 623. The pillar 623 can be coupled to the supporting base 5 via the guiding hole 623b since a fixing component protrudes from the supporting base 5 and inserts into the guiding hole 623b of the pillar 623. Therefore, the pillar 623 is detachably coupled to the supporting base 5, and the pillar 623 can be easily disassembled from the supporting base 5 by removal of the fixing component. The fixing component can be a connector, a tube, a nail, a latch, a screw or a bolt. The pillar 623 with the guiding hole 623b can also improve the capability of the illumination device 11 by conducting heat away from the semiconductor light emitting element 1. According to some embodiments of the present invention, gas or liquid material may be contained in or flowed through the guiding hole 623b of the pillar 623 to conduct more heat, so that life time of the illumination device 11 can be further increased.

As shown in FIG. 38, the pillar 623 may further have at least a slit 623c disposed on at least one end surface of the pillar 623. The slit 623c is extended to connect with one end of the engaging slot 623a, so as to from an open space whereinto the support 62 can be inserted. The support 62 can be moved at a radial direction of the pillar 623 to be engaged inside the engaging slot 623a of the pillar 623, or can be moved at an axial direction of the pillar 623 to be accommodated inside the engaging slot 623a via the slit 623c. Therefore, it will be easy to maintain the illumination device 11 by replacing the failed support 62 or the support 62 with failed semiconductor light emitting elements 1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An illumination device comprising:
a supporting base; and
a light-emitting element inserted in the supporting base, and comprising:
a substrate having a supporting surface and a side surface;
a light-emitting chip disposed on the supporting surface; and
a first wavelength conversion layer covering the light-emitting chip and only a portion of the supporting surface without covering the side surface.

2. The illumination device of claim 1, further comprising a first connecting conductor formed on the supporting surface and electrically connected to the light-emitting chip by a wire.

3. The illumination device of claim 2, wherein the first connecting conductor extends to an edge of the substrate.

4. The illumination device of claim 2, further comprising a second connecting conductor, wherein the first connecting conductor and the second connecting conductor are disposed at opposite sides of the light-emitting chip.

5. The illumination device of claim 1, wherein the supporting base has a socket for receiving the light-emitting element.

6. The illumination device of claim 1, wherein the supporting base is inclined with respect to the light-emitting element by an angle of 30°-150°.

7. The illumination device of claim 1, further comprising a second wavelength conversion layer, wherein the substrate further comprises a main surface opposite to the supporting surface and covered by the second wavelength conversion layer.

8. The illumination device of claim 7, wherein the first wavelength conversion layer and the second wavelength conversion layer have different areas.

9. The illumination device of claim 7, wherein the second wavelength conversion layer does not cover the side surface.

10. The illumination device of claim 1, further comprising a lamp housing enclosing the light-emitting element.

11. An illumination device comprising:
a supporting base; and
a light-emitting element inserted in the supporting base and comprising:
a substrate;
a plurality of light-emitting chips disposed on the supporting base, and having a first chip with a first end, and a last chip with a last end; and
a first connecting conductor disposed on the supporting base and extending beyond the first end.

12. The illumination device of claim 11, further comprising a wavelength conversion layer covering the plurality of light-emitting chips.

13. The illumination device of claim 12, wherein the first connecting conductor is longer than the wavelength conversion layer.

14. The illumination device of claim 12, wherein the wavelength conversion layer has an area less than that of the substrate.

15. The illumination device of claim 11, wherein the first connecting conductor extends to an edge of the substrate.

16. The illumination device of claim 11, wherein the supporting base has a socket for receiving the substrate.

17. The illumination device of claim 11, wherein the first connecting conductor is electrically connected to at least one of the plurality of light-emitting chips by a wire.

18. The illumination device of claim 11, further comprising a second connecting conductor disposed on the substrate and electrically connected to the plurality of light-emitting chips.

19. The illumination device of claim 11, further comprising a lamp housing enclosing the light-emitting element.

20. The illumination device of claim 19, further comprising a base connected to the lamp housing.

* * * * *